United States Patent
Lee et al.

(10) Patent No.: US 12,324,202 B2
(45) Date of Patent: Jun. 3, 2025

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Kai-Hsuan Lee, Hsinchu (TW); Shih-Che Lin, Hsinchu (TW); Po-Yu Huang, Hsinchu (TW); Shih-Chieh Wu, Hsinchu (TW); I-Wen Wu, Hsinchu (TW); Chen-Ming Lee, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 566 days.

(21) Appl. No.: 17/531,258

(22) Filed: Nov. 19, 2021

(65) Prior Publication Data
US 2022/0367623 A1  Nov. 17, 2022

Related U.S. Application Data

(60) Provisional application No. 63/186,912, filed on May 11, 2021.

(51) Int. Cl.
*H10D 62/10* (2025.01)
*H10D 30/01* (2025.01)
(Continued)

(52) U.S. Cl.
CPC ......... *H10D 62/118* (2025.01); *H10D 30/031* (2025.01); *H10D 30/6713* (2025.01); *H10D 30/6735* (2025.01); *H10D 64/021* (2025.01)

(58) Field of Classification Search
CPC ......... H01L 21/28518; H01L 21/76834; H01L 29/165; H01L 29/267; H01L 29/665; H01L 2221/1063; H01L 29/7848; H01L 29/66545; H01L 29/775; H01L 29/66795; H01L 29/42356; H01L 29/785;
(Continued)

(56) References Cited

U.S. PATENT DOCUMENTS 9,754,840 B2  9/2017 Lin et al.
9,818,872 B2  11/2017 Ching et al.
(Continued)

FOREIGN PATENT DOCUMENTS

TW  202036910 A  10/2020

*Primary Examiner* — Suberr L Chi
*Assistant Examiner* — William C. Trice, III
(74) *Attorney, Agent, or Firm* — HAYNES AND BOONE, LLP

(57) ABSTRACT

A semiconductor device structure includes nanostructures formed over a substrate. The structure also includes a gate structure formed over and around the nanostructures. The structure also includes a spacer layer formed over a sidewall of the gate structure over the nanostructures. The structure also includes a source/drain epitaxial structure formed adjacent to the spacer layer. The structure also includes a contact structure formed over the source/drain epitaxial structure with an air spacer formed between the spacer layer and the contact structure.

20 Claims, 26 Drawing Sheets

(51) Int. Cl.
*H10D 30/67* (2025.01)
*H10D 64/01* (2025.01)

(58) Field of Classification Search
CPC ........... H01L 29/0673; H01L 29/78696; H01L 29/42392; H01L 29/0847; H01L 29/515; H01L 29/6656; H01L 29/66553
See application file for complete search history.

(56) References Cited

U.S. PATENT DOCUMENTS

| | | |
|---|---|---|
| 10,032,627 B2 | 7/2018 | Lee et al. |
| 10,290,546 B2 | 5/2019 | Chiang et al. |
| 10,475,902 B2 | 11/2019 | Lee et al. |
| 10,950,731 B1 | 3/2021 | Peng et al. |
| 11,031,292 B2 | 6/2021 | Ju et al. |
| 2017/0365604 A1* | 12/2017 | Suh ................. H01L 21/823878 |
| 2020/0161169 A1 | 5/2020 | Park |
| 2021/0098365 A1 | 4/2021 | Chou |
| 2021/0134973 A1 | 5/2021 | Huang |
| 2022/0069101 A1* | 3/2022 | Choi ................. H01L 29/66439 |
| 2022/0238689 A1* | 7/2022 | Yoon ................. H01L 29/0649 |

* cited by examiner

SEMICONDUCTOR DEVICE STRUCTURE AND METHOD FOR FORMING THE SAME

CROSS REFERENCE TO RELATED APPLICATIONS

This application claims the benefit of U.S. Provisional Application No. 63/186,912, filed on May 11, 2021, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all-around transistor (GAA). The GAA device gets its name from the gate structure which can extend around the channel region, accessing the channel on two or four sides. GAA devices are compatible with conventional complementary metal-oxide-semiconductor (CMOS) processes.

GAA devices are not immune to parasitic capacitance, which may impact device performance. While existing GAA structures and fabrication methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
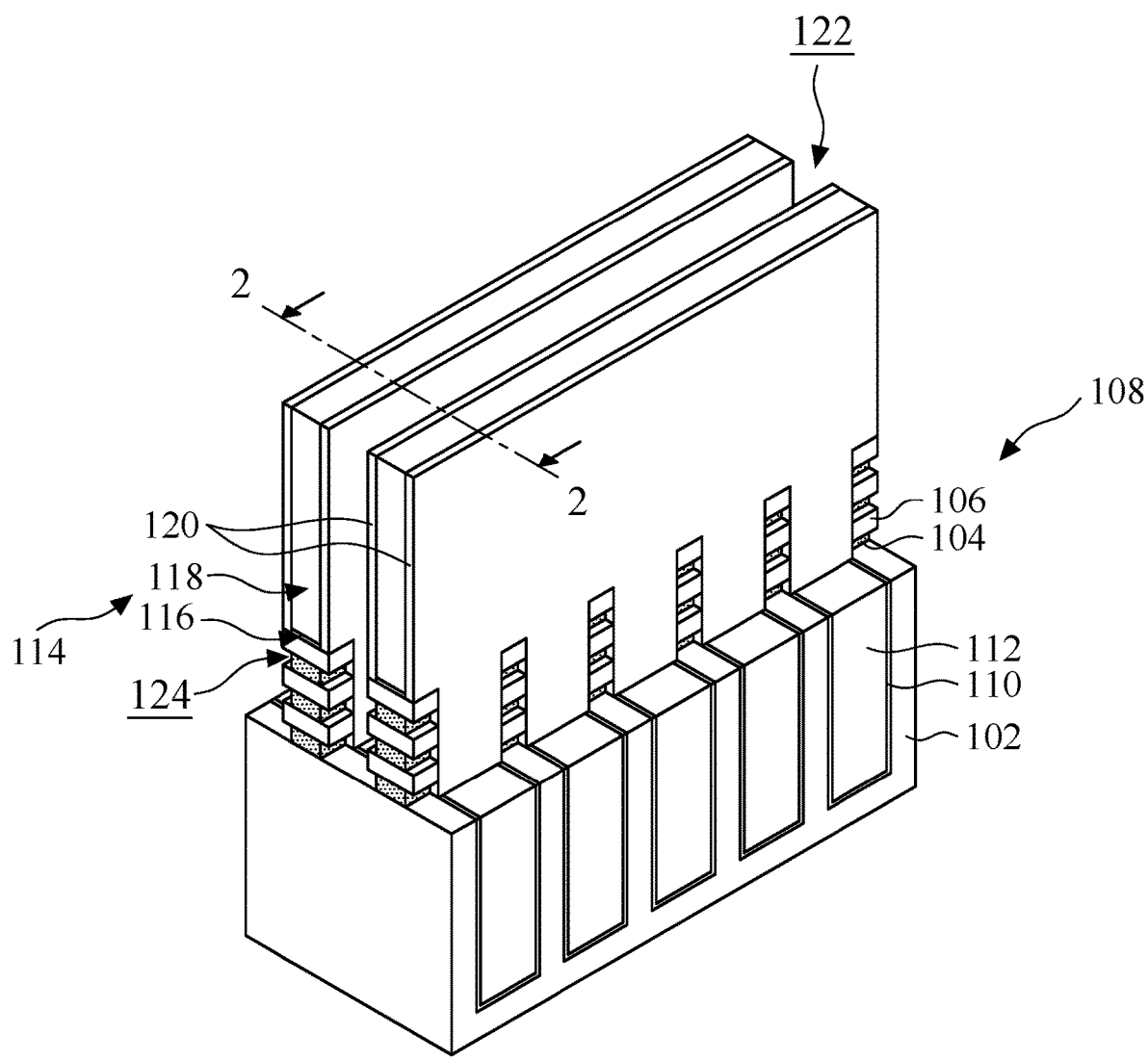
FIG. 1 is a perspective representation of a semiconductor device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Various features in the gate all around (GAA) transistor structures described below may be patterned by any suitable method. For example, active regions and gate structures of GAA transistors may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the active regions or the gate structures of the GAA transistor.

Embodiments for forming a semiconductor device structure are provided. The method for forming the semiconductor device structure may include forming an air spacer between the spacer layers and the contact structure. The air spacer may be formed by a seal liner layer. With the air spacer, the parasitic capacitance may be reduced.

Figure 2A:
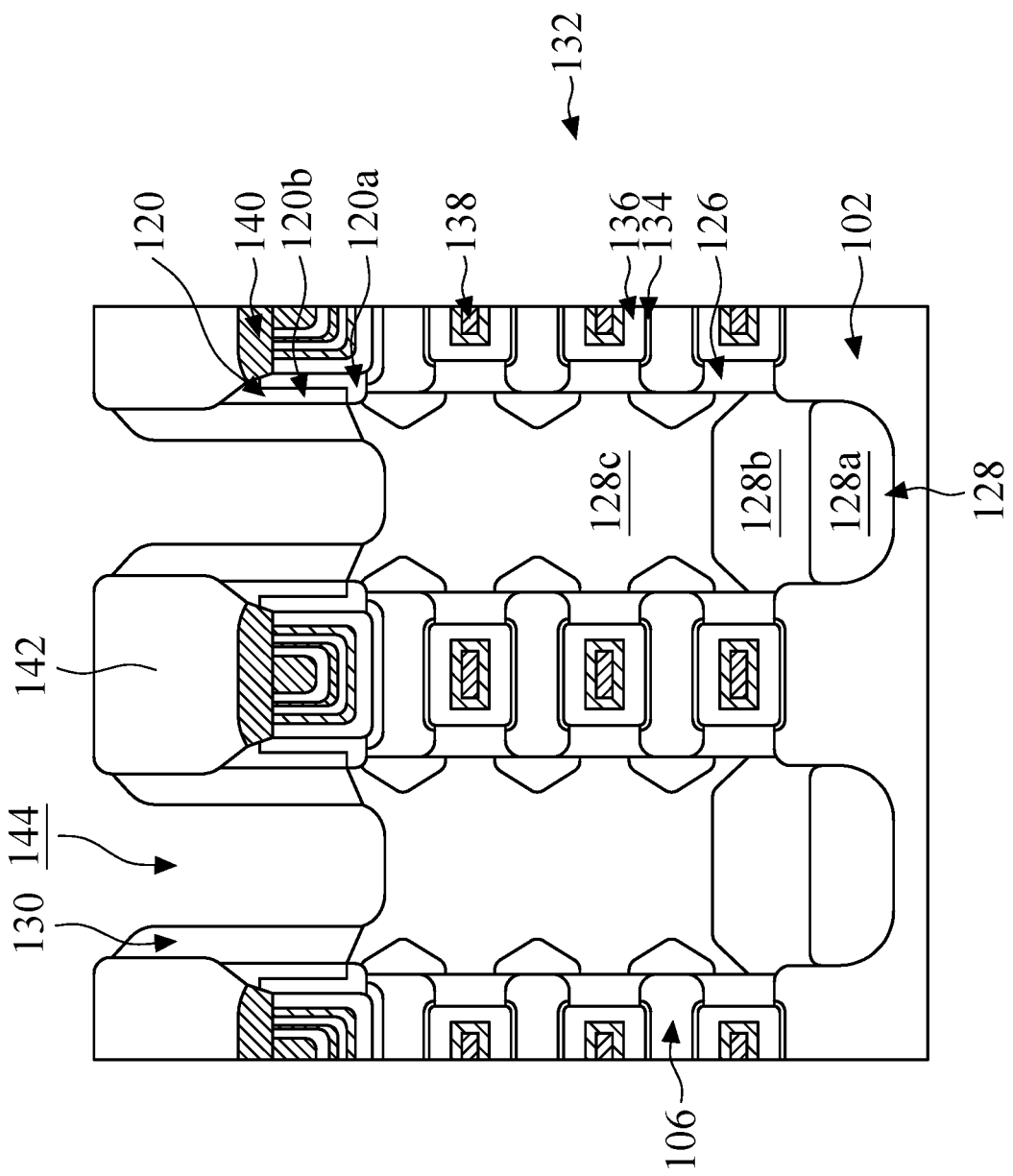
FIGS. 2A-2J are cross-sectional representations of various stages of forming a semiconductor device structure, in accordance with some embodiments of the disclosure.
Figure 2B:
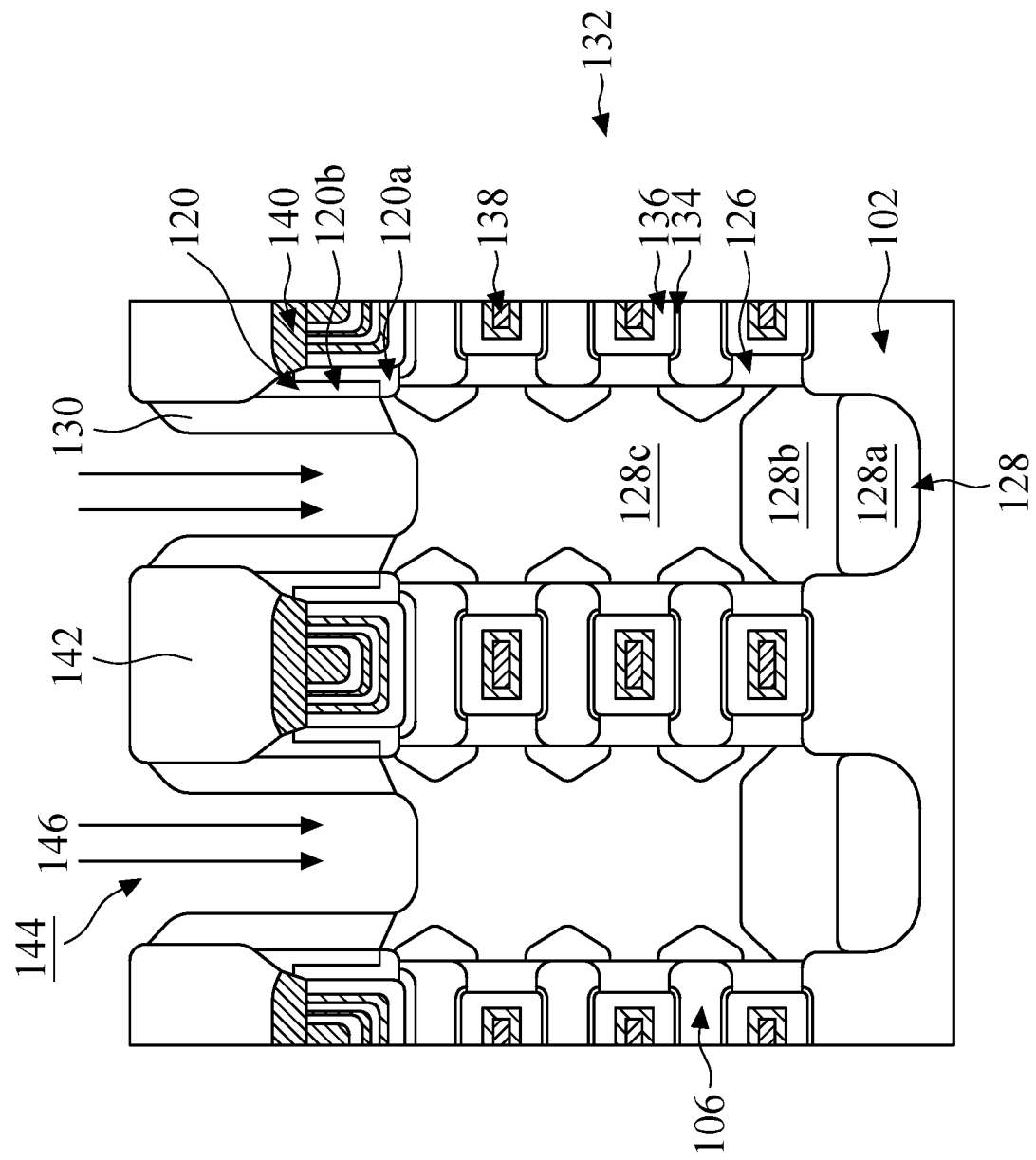
Figure 2C:
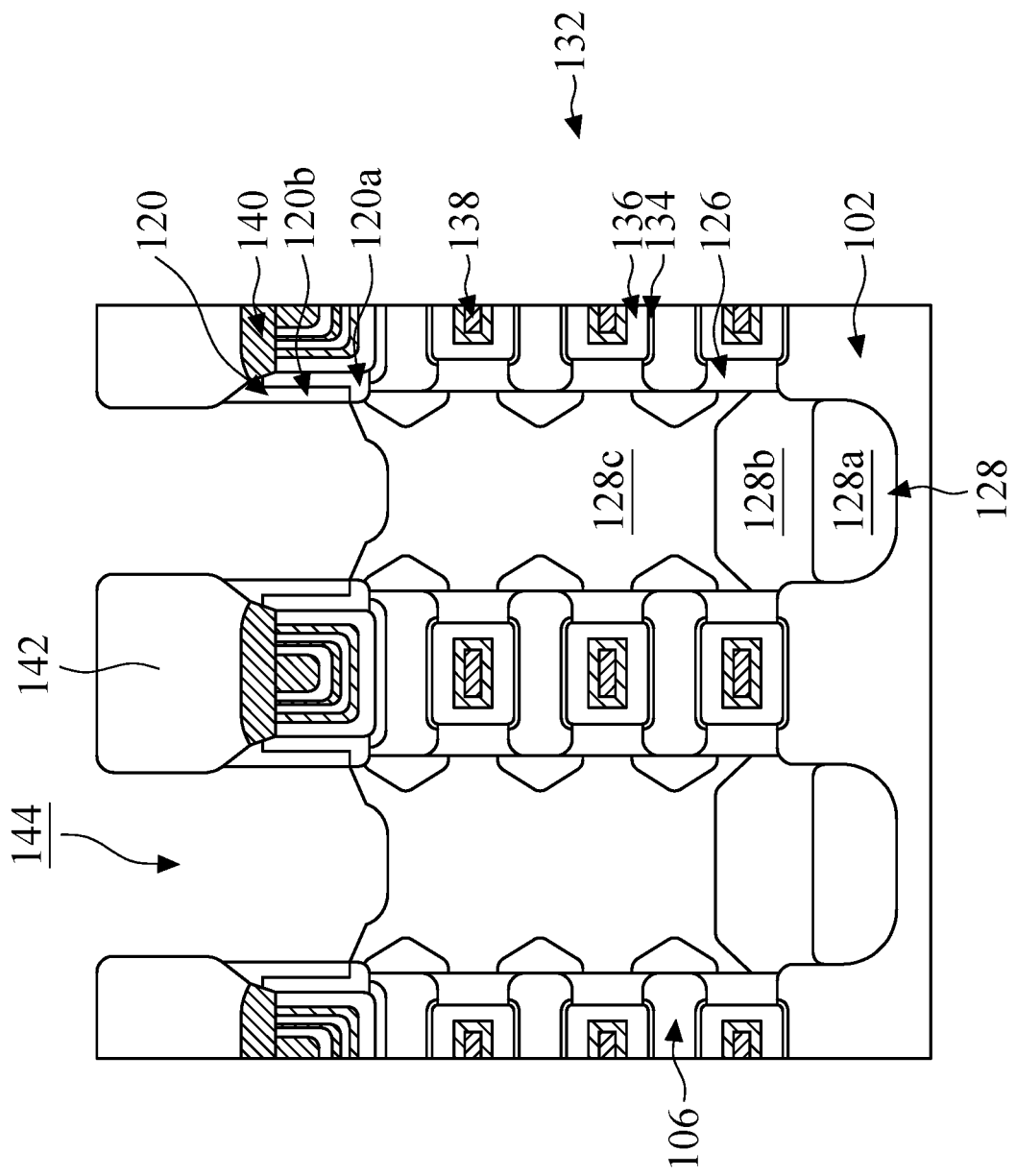
Figure 2D:
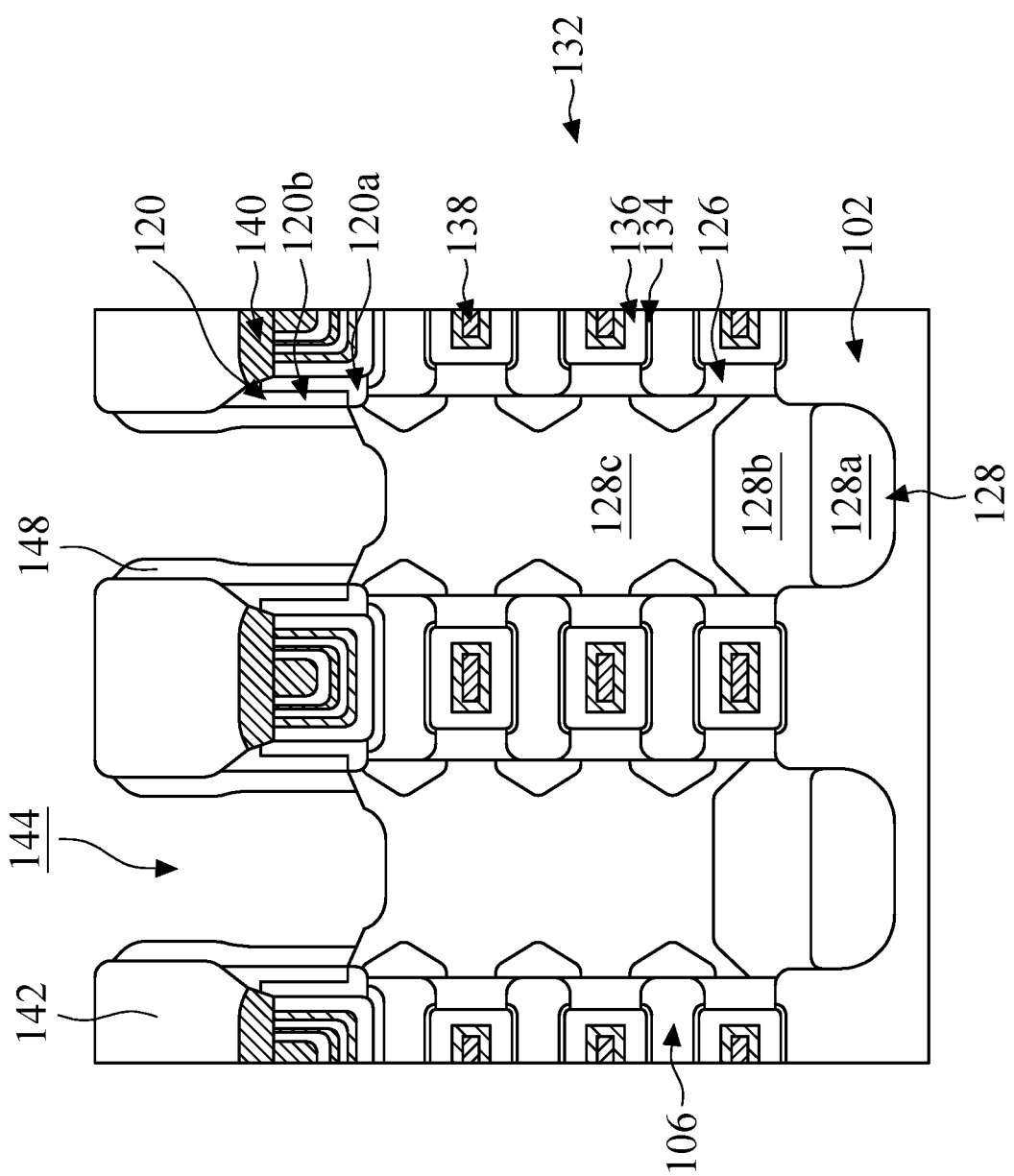
Figure 2E:
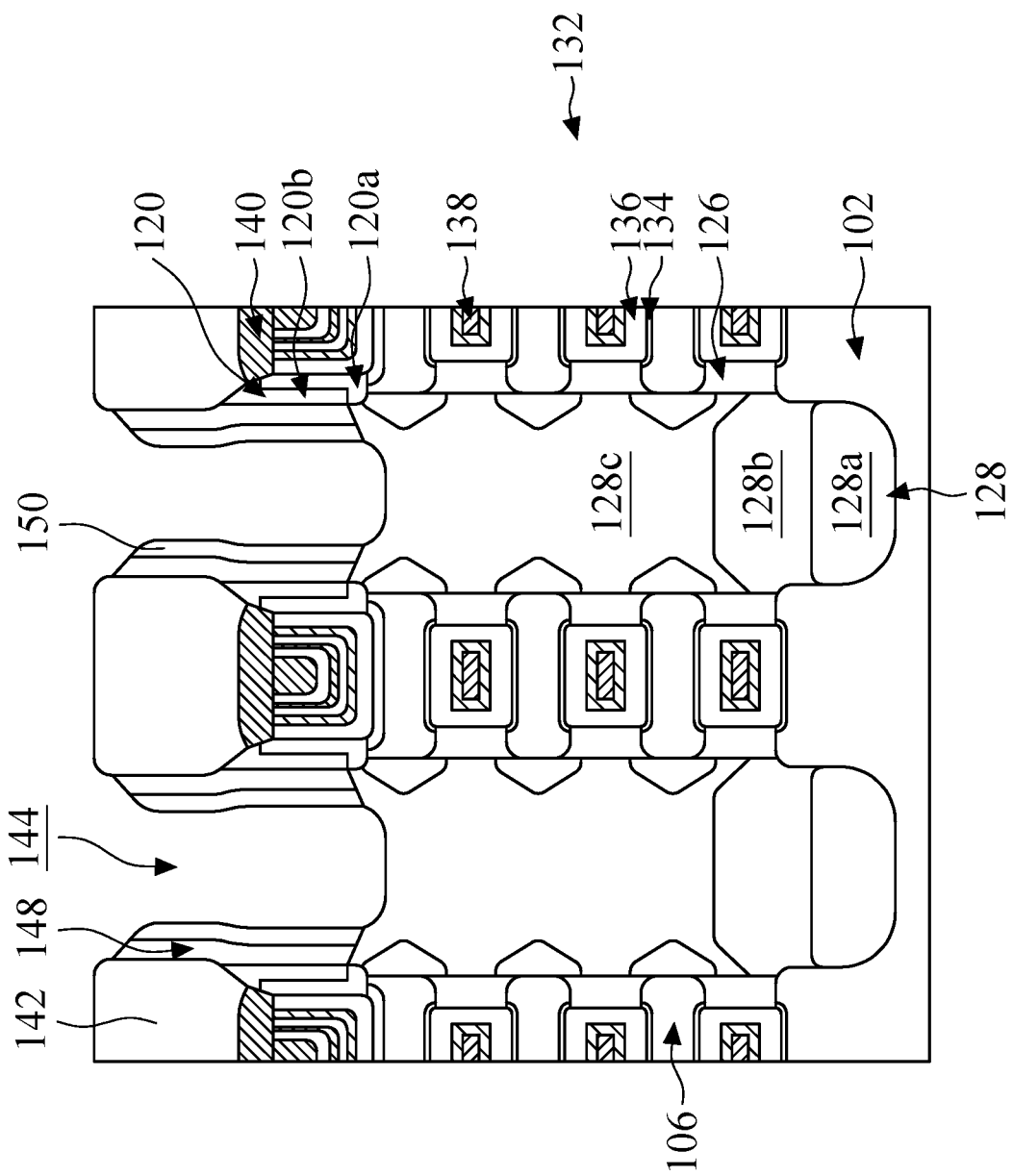
Figure 2F:
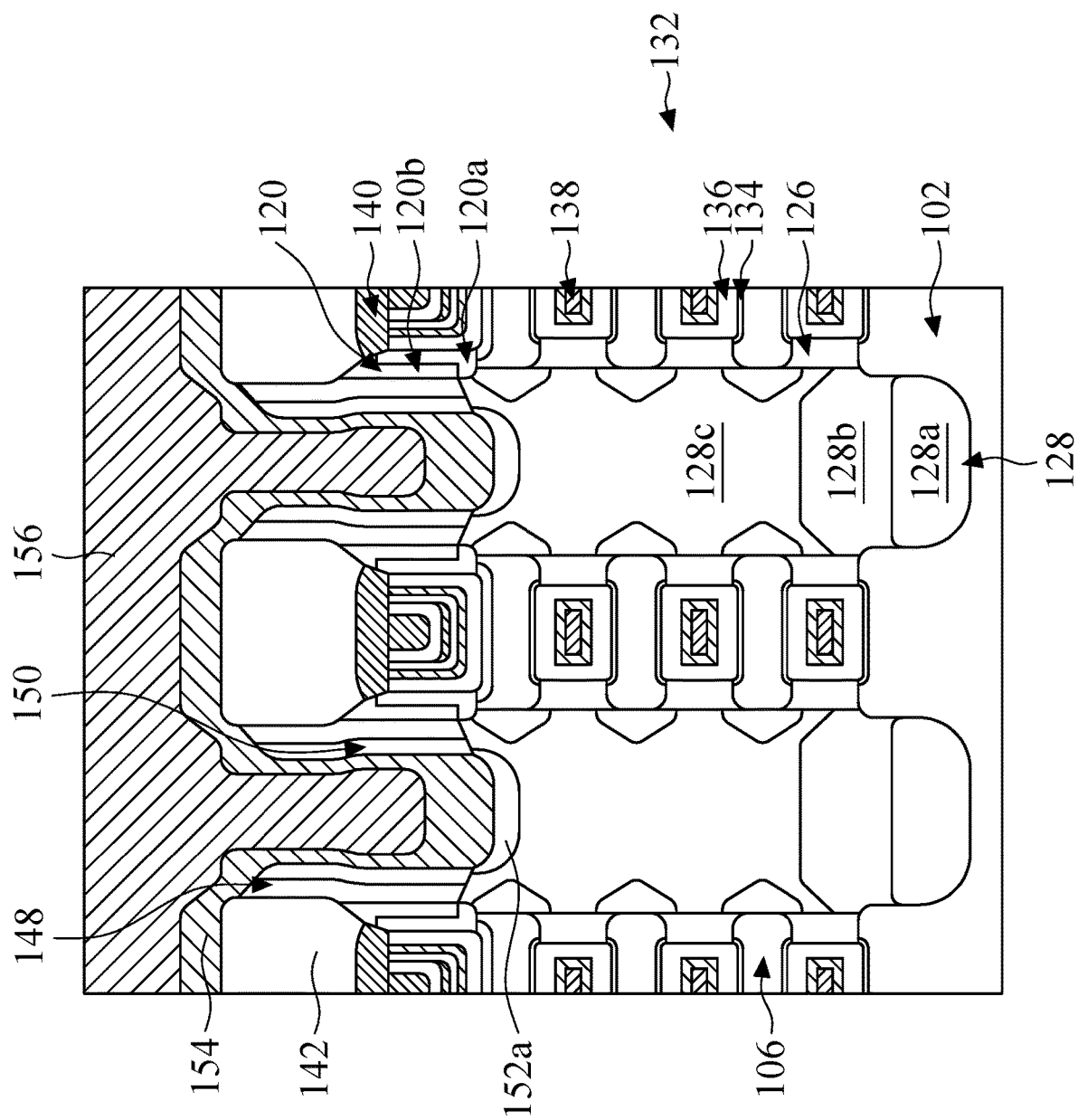
Figure 2G:
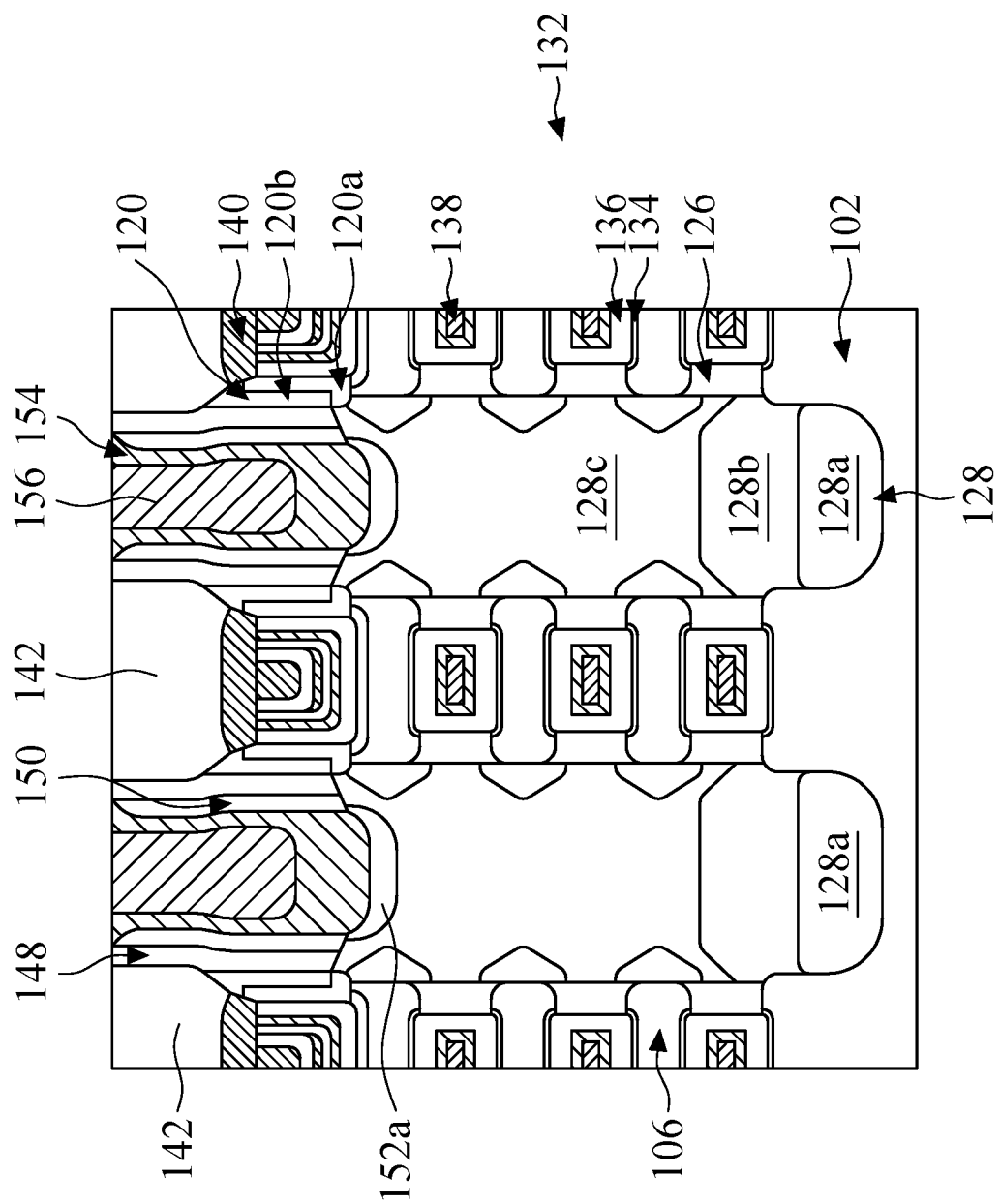
Figure 2H:
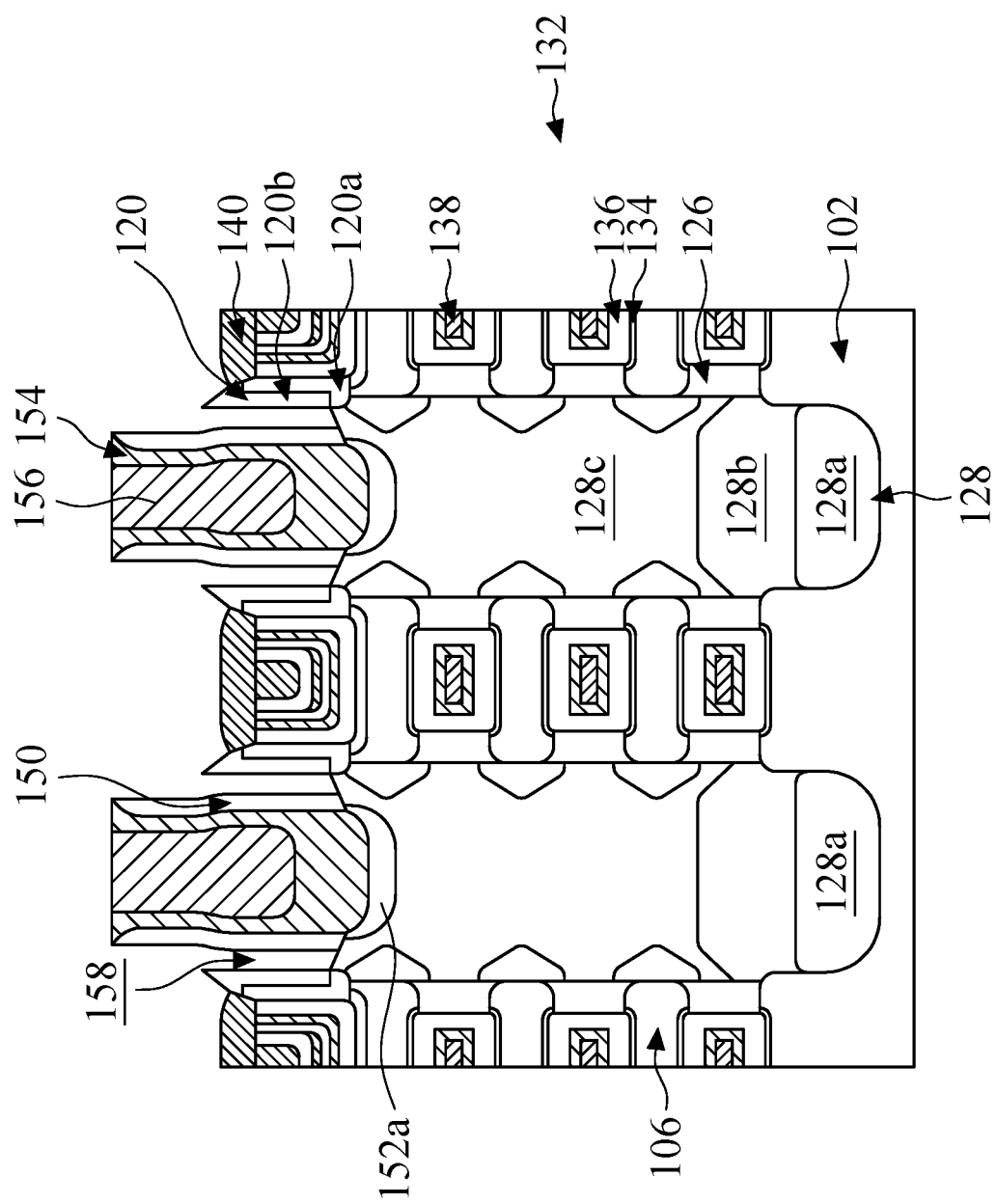
Figure 2I:
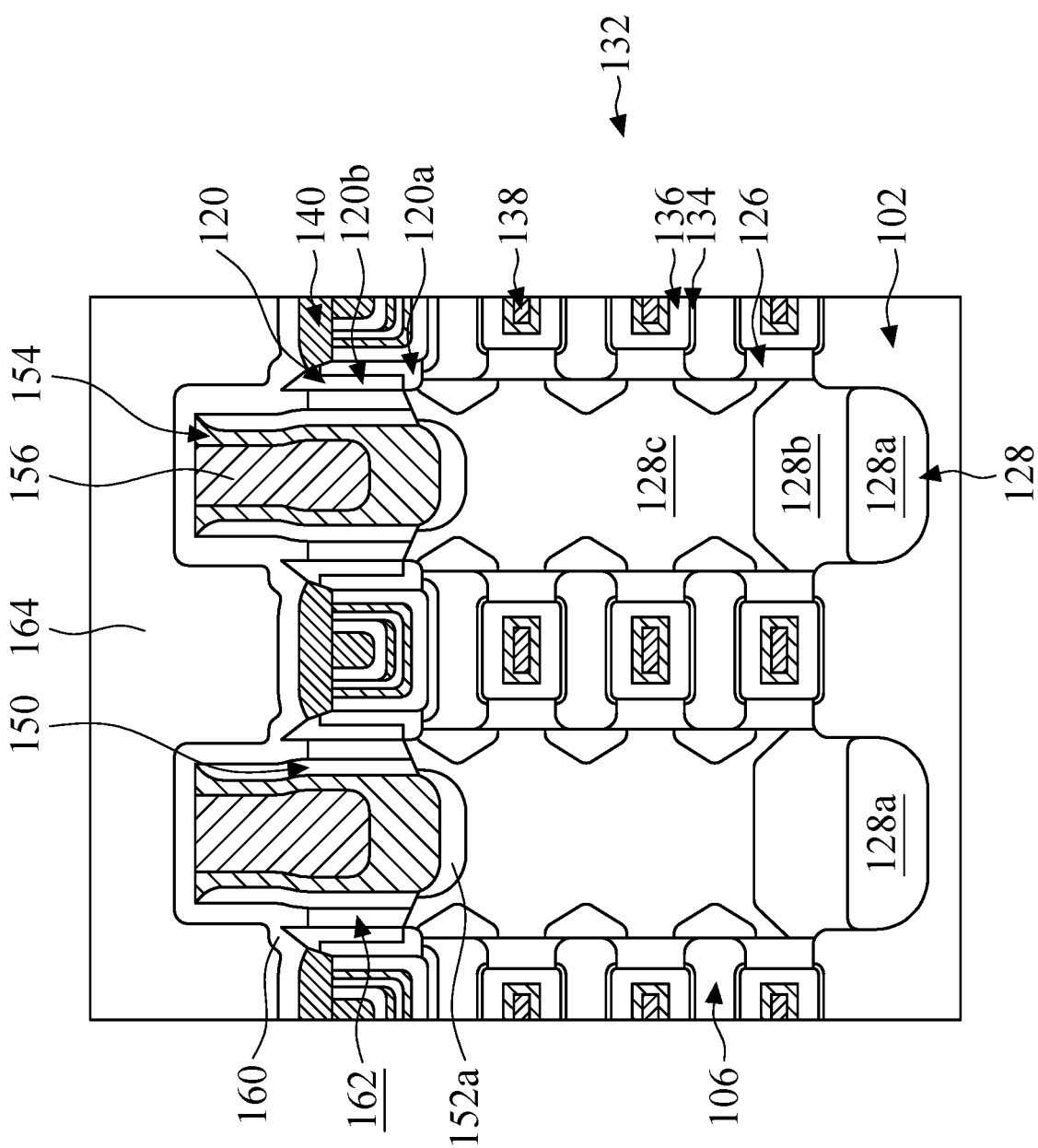
Figure 2J:
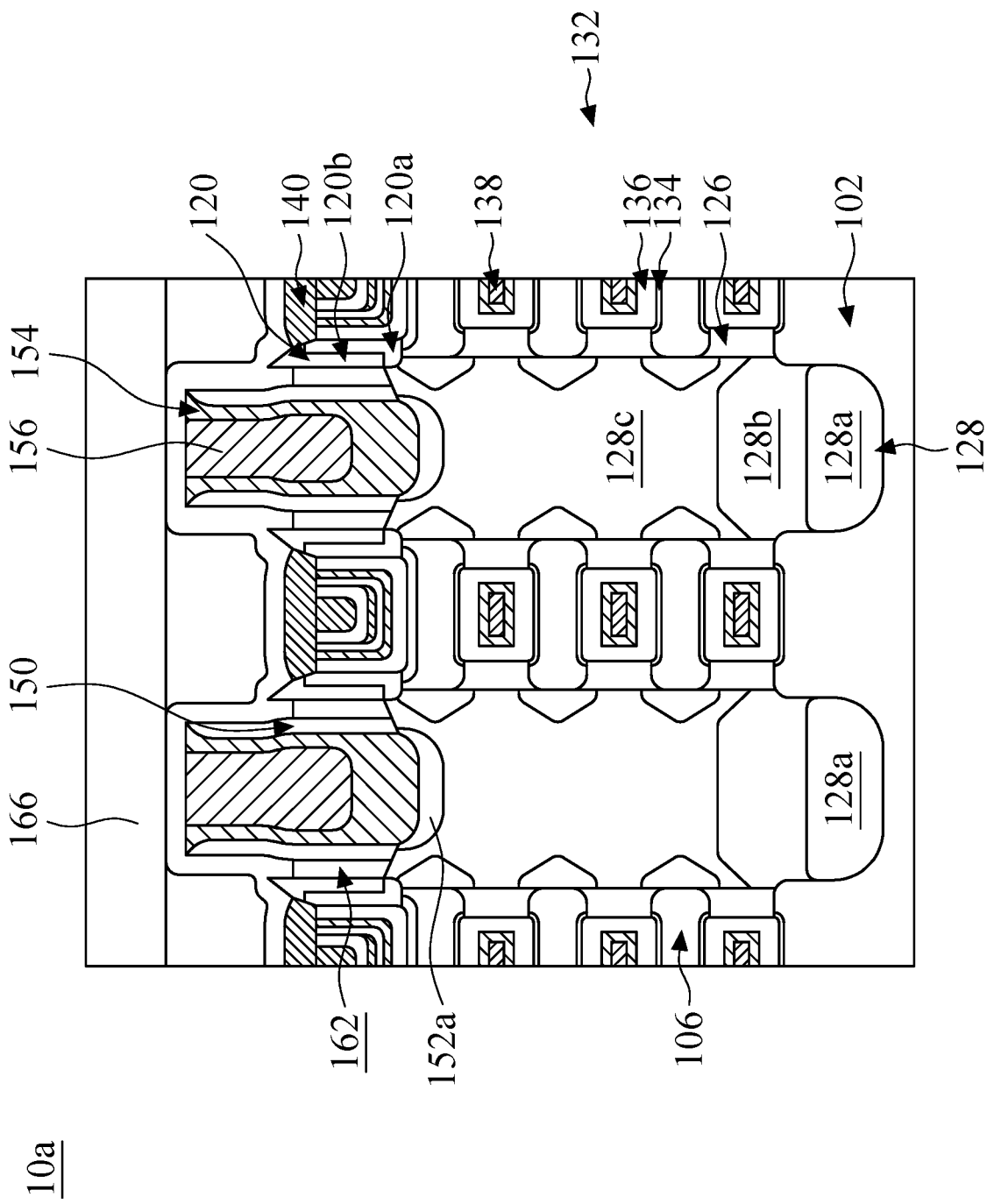

FIG. 1 is a perspective representation of a workpiece for a semiconductor device structure 10a shown in FIG. 2J, in accordance with some embodiments of the disclosure. The semiconductor device structure 10a is a gate all around (GAA) transistor structure. FIGS. 2A-2J are cross-sectional representations of various stages of forming the semiconductor device structure 10a, in accordance with some embodiments of the disclosure. FIGS. 2A-2J show cross-sectional representations taken along line 2-2 in FIG. 1.

A substrate 102 is provided as shown in FIGS. 1 and 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, first semiconductor layers 104 and second semiconductor layers 106 are alternatingly stacked over the substrate 102, as shown in FIG. 1 in accordance with some embodiments. The first semiconductor layers 104 and the second semiconductor layers 106 may include Si, Ge, SiGe, GaAs, InSb, GaP, GaSb, InAlAs, InGaAs, GaSbP, GaAsSb, or InP. The first semiconductor layers 104 and second semiconductor layers 106 may be made of different materials with different etching rates. In some embodiments, the first semiconductor layers 104 include SiGe and the second semiconductor layers 106 include Si.

The first semiconductor layers 104 and second semiconductor layers 106 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor layers 104 and three layers of the second semiconductor layers 106 shown in FIG. 1, the workpiece may include less or more first semiconductor layers 104 and second semiconductor layers 106, depending on the design of the semiconductor device structure 10a and processes forming the same.

Next, a hard mask layer may be formed and patterned over the first semiconductor layers 104 and second semiconductor layers 106 (not shown). The first semiconductor layers 104 and second semiconductor layers 106 may be patterned to form fin structures 108 using the patterned hard mask layer as a mask layer. The patterning process may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the fin structures 108 are formed, a liner layer 110 is formed in the trenches between the fin structures 108, as shown in FIG. 1 in accordance with some embodiments. The liner layer 110 may be conformally formed over the substrate 102, the fin structure 108, and the hard mask layer covering the fin structure. The liner layer 110 may be used to protect the fin structure 108 from being damaged in the following processes (such as an anneal process or an etching process). The liner layer 110 may be made of silicon nitride. The liner layer 110 may be formed by using a CVD process, an atomic layer deposition (ALD) process, a LPCVD process, a plasma enhanced CVD (PECVD) process, a HDPCVD process, another applicable process, or a combination thereof.

Next, an isolation structure material 112 may be then deposited over the liner layer 110 in the trenches between the fin structures 108. The isolation structure 112 may be made of silicon oxide, silicon nitride, silicon oxynitride, fluoride-doped silicate glass (FSG), or another low-k dielectric material. The isolation structure 112 may be deposited by a deposition process, such as a chemical vapor deposition (CVD) process, a spin-on-glass process, or another applicable process.

Next, an etching process may be performed on the isolation structure 112 and the liner layer 110. The etching process may be used to remove the top portion of the liner layer 110 and the top portion of the isolation structure 112. As a result, the first semiconductor layers 104 and the second semiconductor layers 106 may be exposed and the remaining isolation structure 112 and the liner layer 110 may surround the base portion of the fin structure 108. The remaining isolation structure 112 may be a shallow trench isolation (STI) structure surrounding the base portion of the fin structure 108. The isolation structure 112 may be configured to prevent electrical interference or crosstalk. Therefore, trenches may be formed between the fin structures 108.

Next, a dummy gate structure 114 is formed over and across the fin structures 108, as shown in FIG. 1 in accordance with some embodiments. The dummy gate structure 114 may include a dummy gate dielectric layer 116 and a dummy gate electrode layer 118. The dummy gate dielectric layer 116 and the dummy gate electrode layer 118 may be replaced by the following steps to form a real gate structure with a high-k dielectric layer and a metal gate electrode layer 140 shown in FIG. 2A.

The dummy gate dielectric layer 116 may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer 116 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 118 may include polycrystalline-silicon (poly-Si), poly-crystalline silicon-germanium (poly-SiGe), other applicable materials, or a combination thereof. The dummy gate electrode layer 118 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the dummy gate dielectric layer 116 and the dummy gate electrode layer 118 to form the dummy gate structure 114 by using a patterned photoresist layer as a mask (not shown). The etching process may be a dry etching process. The dummy gate dielectric layer 116 and a dummy gate electrode layer 118 may be etched by a dry etching process. The dry etching process may include using a fluorine-based etchant gas, such as $SF_6$, $C_xF_y$ (where x and y may be positive integers), $NF_3$, or a combination thereof. After the etching process, the first semiconductor layers 104 and the second semiconductor layers 106 may be exposed on opposite sides of the dummy gate structure 114.

Next, a pair of spacer layers 120 is formed on opposite sidewalls of the dummy gate structure 114, as shown in FIGS. 1 and 2A in accordance with some embodiments. The spacer layers 120 may be made of silicon oxide, silicon nitride, silicon oxynitride, and/or dielectric materials. The spacer layers 120 may be formed by a chemical vapor deposition (CVD) process, ALD or another applicable process.

In some embodiments as shown in FIG. 2A, each of the spacer layers 120 include an inner portion 120a and an outer portion 120b. The inner portion 120a of the spacer layers 120 covers the sidewalls of the dummy gate structure 114 and the top surface of the stack of the second semiconductor layers 106 and the first semiconductor layers 104. The outer portion 120b of the spacer layers 120 is formed over the sidewall and the top surface of the inner portion 120a of the spacer layers 120. The inner portion 120a of the spacer layers 120 may include more carbon and nitrogen to avoid being consumed in subsequent etching process. The outer portion 120b of the spacer layers 120 may include more oxygen to reduce the k-value.

Afterwards, the first semiconductor layers 104 and the second semiconductor layers 106 of the fin structure 108 not covered by the dummy gate structure 114 may be removed in an etching process to form a source/drain opening 122, as shown in FIG. 1 in accordance with some embodiments. The etching process may be a dry etching process. The dry etching process may include using a fluorine-based etchant gas, such as $SF_6$, $C_xF_y$ (where x and y may be positive integers), $NF_3$, or a combination thereof.

Next, the first semiconductor layers 104 are laterally etched from the source/drain opening 122 to form recesses 124, as shown in FIG. 1 in accordance with some embodiments. The outer portions of the first semiconductor layers 104 may be removed, and the inner portions of the first semiconductor layers 104 under the dummy gate structures 114 or the spacer layers 120 may remain. The lateral etching of the first semiconductor layers 104 may be a dry etching process, a wet etching process, or a combination thereof. After the lateral etching, the sidewalls of the etched first semiconductor layers 104 may be not aligned with the sidewalls of the second semiconductor layers 106.

Next, an inner spacer 126 is formed in the recess 124, as shown in FIG. 2A in accordance with some embodiments. The inner spacer 126 may provide a barrier between subsequently formed source/drain epitaxial structures and gate structure. The inner spacer 126 may be made of silicon oxide, silicon nitride, silicon carbon nitride (SiCN), silicon oxide carbonitride (SiOCN), or a combination thereof. The inner spacer 126 may be formed by a deposition process and an etch-back process. The deposition process may include a CVD process (such as LPCVD, PECVD, SACVD, or FCVD), an ALD process, another applicable method, or a combination thereof. The etch-back process may include a dry etching process or a wet etching process.

Next, a source/drain epitaxial structure 128 is formed in the source/drain opening 122, as shown in FIG. 2A in accordance with some embodiments. As shown in FIG. 2A, the source/drain epitaxial structure 128 is formed over opposite sides of the fin structure 108.

A strained material may be grown in the source/drain opening 122 by an epitaxial (epi) process to form the source/drain epitaxial structure 128. In addition, the lattice constant of the strained material may be different from the lattice constant of the substrate 102. The source/drain epitaxial structure 128 may include Ge, SiGe, InAs, InGaAs, InSb, GaAs, GaSb, InAlP, InP, SiC, SiP, other applicable materials, or a combination thereof. The source/drain epitaxial structure 128 may be formed by an epitaxial growth step, such as molecular beam epitaxy (MBE), hydride vapor phase epitaxy (HVPE), liquid phase epitaxy (LPE), chloride vapor phase epitaxy (Cl-VPE), or any other suitable method. The source/drain epitaxial structure 128 may be doped with one or more dopants. For example, when the semiconductor device structure 10a is p-type, source/drain epitaxial structure 128 may be silicon germanium (SiGe) doped with boron (B) or another applicable dopant; and when the semiconductor device structure 10a is n-type, source/drain epitaxial structure 128 may include silicon (Si) doped with phosphorus (P) or another applicable dopant.

In some embodiments as shown in FIG. 2A, the source/drain epitaxial structure 128 includes a bottom portion 128a, an edge portion 128b, and a center portion 128c. The bottom portion 128a may be formed at the bottom of the source/drain opening 122. The edge portion 128b may be formed over the bottom portion 128a in the source/drain opening 122 and over the sidewall of the second semiconductor layers 106. The center portion 128c may be filled the source/drain opening 122.

The strain and the dopant concentrations in the bottom portion 128a, the edge portion 128b, and the center portion 128c of the source/drain epitaxial structure 128 may be different. For example, the strain of the bottom portion 128a may be less than the strain of the edge portion 128b, and the strain of the edge portion 128b may be less than the strain of the center portion 128. In addition, the dopant concentration of the bottom portion 128a may be less than the dopant concentration of the edge portion 128b, and the dopant concentration of the edge portion 128b may be less than the dopant concentration of the center portion 128.

The bottom portion 128a of the source/drain epitaxial structure 128 with less strain and dopant concentration may help reduce lattice defects. The edge portion 128b of the source/drain epitaxial structure 128 may help to grow the center portion 128c of the source/drain epitaxial structure 128. The center portion 128c of the source/drain epitaxial structure 128 may dominate the strain and the resistance of the source/drain epitaxial structure 128.

Next, a first contact etch stop layer 130 is formed over the sidewalls of the spacer layers 120, as shown in FIG. 2A in accordance with some embodiments. The first contact etch stop layer 130 may define an implant region in the following implantation process, and also define the dimension of the subsequently formed contact structure. The first contact etch stop layer 130 may include silicon nitride, silicon oxide, silicon oxynitride (SiON), silicon oxycarbonitride (SiOCN), other applicable materials, or a combination thereof. The first contact etch stop layer 130 may be formed by a chemical vapor deposition process (e.g., a plasma enhanced chemical vapor deposition (PECVD) process, an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

An inter-layer dielectric (ILD) structure is formed over the first contact etch stop layer 130 (not shown). The ILD structure may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure may be formed by chemical vapor deposition (CVD), spin-on coating, or other applicable processes.

Afterwards, a planarizing process is performed on the ILD structure until the top surface of the dummy gate structure 114 is exposed (not shown). After the planarizing process, the top surface of the dummy gate structure 114 may be substantially level with the top surfaces of the spacer layers 120, the first contact etch stop layer 130, and the ILD structure. The planarizing process may include a grinding process, a chemical mechanical polishing (CMP) process, an etching process, other applicable processes, or a combination thereof.

Next, the dummy gate structure 114 including the dummy gate dielectric layer 116 and a dummy gate electrode layer 118 is removed (not shown). Therefore, gate trenches are formed between the spacer layers 120 over the fin structure 108 and the second semiconductor layers 106 are exposed from the trench. The dummy gate structure 114 may be removed by a dry etching process or a wet etching process.

After the gate trenches are formed, the first semiconductor layers 104 are removed to form gaps (not shown) between adjacent second conductor layers 106. The removal process may include a selective etching process. The selective etching process may remove the first semiconductor layers 104 to release the second semiconductor layers 106 as a nanostructure 106 as a channel region of the semiconductor device structure 10a, in accordance with some embodiments.

The selective etching process of removing the first semiconductor layers 104 may include a wet etch process, a dry etch process, or a combination thereof. The selective etching process may be a plasma-free dry chemical etching process. The etchant of the dry chemical etching process may include radicals such as HF, $NF_3$, $NH_3$, $H_2$, or a combination thereof.

After the gaps are formed, gate structures 132 are formed surrounding and over the nanostructure 106, as shown in FIG. 2A in accordance with some embodiments. The gate structures 132 may be multi-layered structures. Each of the gate structures 132 may include an interfacial layer 134, a high-k dielectric layer 136, work function layers 138, and a gate electrode layer 140. The gate structure 132 surrounds the nanostructure 106, which may enhance gate control ability. The nanostructure 106 may be surrounded by and in direct contact with the interfacial layers 134, and the interfacial layers 134 may be surrounded by the high-k dielectric layers 136. In addition, the high-k dielectric layers 136 may be surrounded by the work function layers 138.

The interfacial layers 134 may be made of silicon oxide, and the interfacial layers 134 may be formed by thermal oxidation. The high-k dielectric layers 136 may include dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. The high-k dielectric layers 136 may be formed by using CVD, ALD, other applicable methods, or a combination thereof.

The work function layers 138 may be made of metal materials, and the metal materials may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The P-work-function metal may include titanium nitride (TiN), tungsten nitride (WN), tantalum nitride (TaN), ruthenium (Ru) or a combination thereof. The work function layers 138 may be formed by using CVD, ALD, other applicable methods, or a combination thereof.

It should be noted that, the number of the work function layers 138 shown in FIG. 2A is merely an example, and is not limited herein, depending on the demand of the target work function value.

Next, the high-k dielectric layers 136, work function layers 138, and the spacer layers 120 are recessed to form a recess above the gate structure 132 (not shown). The recessing process may include one or more etching processes, such as dry etching and/or wet etching. After the recessing process, the top surface of the spacer layers 120 is higher than the top surfaces of the high-k dielectric layers 136 and the work function layers 138.

Next, the gate electrode layer 140 is formed in the recess over the high-k dielectric layers 136 and the work function layers 138, as shown in FIG. 2A in accordance with some embodiments. The gate electrode layer 140 may be formed to fill in the recess between the work function layers 138. The gate electrode layer 140 may also be formed covering the top surface of the high-k dielectric layers 136 and the work function layers 138 between the spacer layers 120 for a greater landing area of subsequently formed contact structure.

The gate electrode layer 140 may be made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another applicable material, or a combination thereof. The gate electrode layer 140 may be formed by using CVD, ALD, electroplating, another applicable method, or a combination thereof.

Next, a hard mask layer 142 is formed in the recess above the gate structure 132 and the spacers 120, as shown in FIG. 2A in accordance with some embodiments. The hard mask layer 142 may provide isolation for subsequently formed contact structure and conductive elements nearby. The hard mask layer 142 may be made of materials that have etching selectivity with respect to subsequently formed protection layer and the contact structure. More specifically, the hard mask layer 142 may have etching selectivity with respect to SiN and metal. For example, the hard mask layer 142 may include semiconductor oxide, metal oxide, Si, Ge, SiGe, TiN, LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other applicable materials, or a combination thereof. In one embodiment, the hard mask layer 142 may be formed of a semiconductor material, such as Si, Ge, or SiGe. The hard mask layer 142 may be deposited in the recess by CVD (such as HDP-CVD, PECVD, or HARP), ALD, another suitable method, and/or a combination thereof. After the hard mask layer 142 is deposited, a planarization process (e.g., a chemical mechanical polishing process or an etching back process) may optionally be performed to remove excess dielectric materials.

After the hard mask layer 142 is deposited, a planarization process (e.g., a chemical mechanical polishing process or an etching back process) may optionally be performed to remove excess dielectric materials.

Next, the ILD structure over the source/drain epitaxial structure 128 may be removed, and a contact opening 144 may be formed over the source/drain epitaxial structure 128 between the gate structures 132, as shown in FIG. 2A in accordance with some embodiments. The contact opening 144 may be formed by an etching process such as a dry etching process or a wet etching process. As shown in FIG. 2A, the contact opening 144 is defined between first contact etch stop layers 130.

Afterwards, an implantation process 146 is performed over the source/drain epitaxial structure 128, as shown in FIG. 2B in accordance with some embodiments. The implantation process 146 may be a pre-amorphous implantation process, and an amorphous layer may be formed at the top portion of the source/drain epitaxial structure 128. The subsequently formed first metal semiconductor compound layer may be confined in the amorphous area. The implant used in the implantation process 146 may include Si, Ge, C, Xe, other applicable implants, or a combination thereof. The implantation energy or source may be modified to achieve the needed implantation depth.

Next, the first contact etch stop layer 130 is removed, and the sidewalls of the spacer layers 120 and the hard mask layer 142 are exposed, as shown in FIG. 2C in accordance with some embodiments. The first contact etch stop layer 130 may be removed by an etching process such as a dry etching process or a wet etching process.

After the removal of the first contact etch stop layer 130, a dummy layer 148 is formed over the sidewall of the spacer layers 120 and the hard mask layer 142, as shown in FIG. 2D in accordance with some embodiments. The dummy layer 148 may be made of materials that have etching selectivity with respect to subsequently formed protection layer and the contact structure. More specifically, the dummy layer 148 may have etching selectivity with SiN and metal. The dummy layer 148 may include semiconductor oxide, metal oxide, Si, Ge, SiGe, TiN, LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other applicable materials, or a combination thereof. In some embodiments, the dummy layer 148 and the hard mask 142 are made of the same material. In one embodiment, the dummy layer 148 may have the same composition as the hard mask layer 142 and may include semiconductor materials, such as Si, Ge, or SiGe. The dummy layer 148 may be first conformally deposited in the contact opening 144 and over the hard mask layer 142 by ALD, CVD (such as HDP-CVD, PECVD, or HARP), another suitable method, and/or a combination thereof. Afterwards, the dummy layer 148 over the top surfaces of the hard mask 142 and the source/drain epitaxial structure 128 may be etched away, and the top surfaces of the hard mask 142 and the source/drain epitaxial structure 128 may be exposed. The dummy layer 148 may be etched by an isotropic etching process, such as a dry etching process. In some embodiments, the thickness of the dummy layer 148 is less than 10 nm, which is limited by the space between the gate structures 132.

Afterwards, a protection layer 150 is formed over the sidewall of dummy layer 148, as shown in FIG. 2E in accordance with some embodiments. The protection layer 150 may be made of semiconductor nitride, semiconductor oxide, metal oxide, metal nitride, other applicable materials, or a combination thereof. For example, the protection layer 150 may include silicon oxide, silicon nitride, TiN, LaO, AlO, YO, TaCN, SiOCN, SiOC, SiCN, LaO, ZrN, ZrAlO, TiO, TaO, ZrO, HfO, SiN, HfSi, AlON, SiO, SiC, or ZnO. The protection layer 150 may not react with subsequently formed metal layers in the following annealing process. The protection layer 150 may sustain the etching process to remove the dummy layer 148 and the hard mask layer 142 during the following process, or else the gaps for reducing parasitic capacitance may be affected. In one embodiment, while the dummy layer 148 and the hard mask layer 142 are formed of a semiconductor material, such as Si, Ge, or SiGe, the protection layer 150 is formed of silicon nitride, silicon oxynitride, or silicon oxide.

The protection layer 150 may be first conformally deposited in the contact opening 144 and over the hard mask layer 142 by ALD, CVD (such as HDP-CVD, PECVD, or HARP), another suitable method, and/or a combination thereof. Afterwards, the protection layer 150 over the top surfaces of the hard mask 142 and the source/drain epitaxial structure 128 may be etched away, and the top surfaces of the hard mask 142 and the source/drain epitaxial structure 128 may be exposed. The protection layer 150 may be etched by an anisotropic etching process, such as a dry etching process. In some embodiments, the total thickness of the dummy layer 148 and the protection layer 150 and the thickness of the first contact etch stop layer 130 formed in FIG. 2A are substantially the same.

Next, a first silicide layer 152a may be formed over the source/drain epitaxial structure 128, as shown in FIG. 2F in accordance with some embodiments. The first silicide layer 152a may reduce the contact resistance between the source/drain epitaxial structure 128 and the subsequently formed contact structure over the source/drain epitaxial structure 128. The first silicide layer 152a may be made of titanium silicide (TiSi$_2$), nickel silicide (NiSi), cobalt silicide (CoSi), or other suitable low-resistance materials. The first silicide layer 152a may be a first metal semiconductor compound layer 152a. The first silicide layer 152a may be formed over the source/drain epitaxial structure 128 by forming a metal layer over the source/drain epitaxial structure 128 first. The metal layer may react with the source/drain epitaxial structure 128 in an annealing process and a first silicide layer 152a may be produced. Afterwards, the unreacted metal layer may be removed in an etching process and the first silicide layer 152a may be left.

Next, a barrier layer 154 may be conformally formed over the bottom surface and the sidewalls of the contact opening 144, as shown in FIG. 2F in accordance with some embodiments. The barrier layer 154 may be formed before filling the conductive material in the contact opening 144 to prevent the conductive material from diffusing out. The barrier layer 154 may also serve as an adhesive or glue layer. The barrier layer 154 may also serve as a seed layer for forming the conductive material in the contact opening 144. The material of the barrier layer 154 may be TiN, Ti, TaN, Ta, other applicable materials, or a combination thereof. The barrier layer 154 may be formed by depositing the barrier layer 154 materials by a physical vapor deposition process (PVD) (e.g., evaporation or sputtering), an atomic layer deposition process (ALD), an electroplating process, other applicable processes, or a combination thereof.

Afterwards, a conductive material is formed into the contact opening 144 and a contact structure 156 is formed over the source/drain epitaxial structure 128, as shown in FIG. 2F in accordance with some embodiments. The contact structure 156 may include the barrier layer 154 and the conductive material filled in the contact opening 144. The conductive material may be made of metal materials (e.g., Co, Ni, W, Ti, Ta, Cu, Al, Ru, Mo, TiN, TaN, and/or a combination thereof), metal alloys, other applicable conductive materials, or a combination thereof. The conductive material may be formed by a chemical vapor deposition process (CVD), a physical vapor deposition process (PVD), (e.g., evaporation or sputter), an atomic layer deposition process (ALD), an electroplating process, another suitable process, or a combination thereof.

Then, a planarization process such as a chemical mechanical polishing (CMP) process or an etch back process is optionally performed to remove excess conductive materials, as shown in FIG. 2G in accordance with some embodiments. The top surface of the hard mask 142 may be exposed after the planarization process. After the planarization process, the top surface of the contact structure 156 may be level with the top surfaces of the hard mask layer 142, the dummy layer 148, and the protection layer 150.

Next, the hard mask layer 142 and the dummy layer 148 are removed, and a trench 158 is formed between the spacer layer 120 and the protection layer 150, as shown in FIG. 2H in accordance with some embodiments. In some embodiments, the sidewalls of the spacer layer 120 and the protection layer 150 and a portion of the top surface of the source/drain epitaxial structure 128 are exposed from the trench 158. Since the material of the hard mask layer 142 and the dummy layer 148 has etching selectivity with respect to the material of the contact structure 156 and the protection layer 150, the contact structure 156 and the protection layer 150 may substantially remain after removing the hard mask layer 142 and the dummy layer 148. The hard mask layer 142 and the dummy layer 148 may be removed by an etching process such as a dry etching process or a wet etching process. In some embodiments, there is a height difference between the bottom surface of the trench 158 and the top surfaces of the gate structure 132 and the spacer layers 120.

Next, a seal liner layer 160 is formed over the gate structure 132 and the contact structure 156, as shown in FIG. 2I in accordance with some embodiments. In some embodiments, the trench 158 between the spacer layer 120 and the protection layer 150 is sealed by the seal liner layer 160, and an air spacer 162 is formed under the seal liner layer 160, as shown in FIG. 2I in accordance with some embodiments. In some embodiments, the seal liner layer 160 is conformally formed over the gate structure 132 and the contact structure 156. In some embodiments, the seal liner layer 160 is deposited over the air spacer 162. In some embodiments, the air spacer 162 is formed between the spacer layer 120 and the contact structure 156. In some embodiments, the air spacer 162 is formed between the protection layer 150 and the gate structure 132. In some embodiments, the top surface of the air spacer 162 is lower than the top surface of the contact structure 156. In some embodiments, the top surface of the air spacer 162 is lower than the top surface of the spacer layers 120.

The seal liner layer 160 may have a low k-value, and may remain in the subsequent etching process. In some embodiments, the seal liner layer 160 and the protection layer 150 are made of different materials. The air spacer 162 may help to reduce the parasitic capacitance. In some embodiments, the seal liner layer 160 may be made of SiOCN. The silicon composition in the seal liner layer 160 is in a range from about 30% to about 40%. The oxygen composition in the seal liner layer 160 is in a range of about 30% to about 60%. A higher oxygen composition may help to reduce the k-value. However, if the oxygen composition is too high, it may be difficult to retain the seal liner layer 160 during the subsequent etching process. The carbon composition in the seal liner layer 160 is in a range of about 1% to about 30%. A higher carbon composition may help to reduce the k-value. However, if the carbon composition is too high, it may be difficult to keep the seal liner layer 160 during the subsequent etching process. The nitrogen composition in the seal liner layer 160 is in a range of about 5% to about 30%. A higher nitrogen composition in the seal liner layer 160 may help to retain the seal liner layer 160 in the subsequent etching process. However, if the nitrogen composition is too high, the k-value may be too high.

In some embodiments, the seal liner layer 160 and the protection layer 150 are made of the same material. Therefore, the interface between the seal liner layer 160 and the protection layer 150 may be less observable or even not observable.

The seal liner layer 160 may be formed by an atomic layer deposition process (ALD), a chemical vapor deposition process (CVD), a physical vapor deposition process (PVD), (e.g., evaporation or sputter), an electroplating process, another suitable process, or a combination thereof. In some embodiment, the seal liner layer 160 is formed by an ALD-like deposition process.

Next, a filling film 164 is formed over the seal liner layer 160, as shown in FIG. 2I in accordance with some embodiments. The filling film 164 may be deposited over the gate structure 132 between adjacent contact structures 156. The filling film 164 may have a low k-value to reduce parasitic capacitance. The filling film 164 may be made of silicon oxide, silicon oxycarbide, silicon oxycarbonitride, silicon nitride, silicon oxynitride, undoped silicate glass, phosphosilicate glass (PSG), borophosphosilicate glass (BPSG), fluorosilicate glass (FSG), low-k metal oxide, or other applicable materials, or a combination thereof. Example low-k metal oxides may include porous metal oxide species, such as aluminum oxide, magnesium oxide, zinc oxide, indium zinc oxide (IZO), or indium gallium zinc oxide (IGZO). The filling film 164 may be formed by a physical vapor deposition process (PVD), (e.g., evaporation or sputter), a chemical vapor deposition process (CVD), a flowable CVD (FCVD) process, a spin-on coating process, another suitable process, or a combination thereof. In some embodiments, the filling film 164 is formed by an PVD-like deposition process.

Next, a planarization process is performed over the filling film 164 until the top surface of the seal liner layer 160 is exposed, as shown in FIG. 2J in accordance with some embodiments. The planarizing process may include a grinding process, a chemical mechanical polishing (CMP) process, an etching process, other applicable processes, or a combination thereof.

Next, a second contact etch stop layer 166 is formed over the filling film 164 and the seal liner layer 160, as shown in FIG. 2J in accordance with some embodiments. The second contact etch stop layer 166 may have the same composition as the first contact etch stop layer 130. In some alternative embodiments, the second contact etch stop layer 166 may include SiC, LaO, AlO, AlON, ZrO, HfO, SiN, ZnO, ZrN, ZrAlO, TiO, TaO, YO, TaCN, ZrSi, SiOCN, SiOC, SiCN, HfSi, SiO, or undoped silicon. The second contact etch stop layer 166 may be formed using CVD (such as LPCVD, PECVD, HDP-CVD, HARP, and FCVD), ALD, another suitable method, or a combination thereof.

With the dummy layer 148 and the hard mask layer 142 over the gate structure 132 being formed of the same material, a trench 158 may be formed between the protection layer 150 and the spacer layer 120 after removing the dummy layer 148 and the hard mask layer 142. A seal liner layer 160 is deposited over the trench 158 and an air spacer 162 may be formed. As described herein, the air spacer 162 is a sealed gap that may be filled with gas species present in the gap right before the gap is sealed by the seal liner layer 160. In some instances where the process chamber is under vacuum, the seal gap (i.e., the air spacer 162) may include little or no gas species. With the air spacer 162 formed between the spacer layer 120 and the contact structure 156, the parasitic capacitance may be reduced. In the embodiments represented in FIG. 2J, the air spacer 162 may have a width between about 1 nm and about 10 nm and a height between about 10 nm and about 30 nm. In these embodiments, the air spacer 162 may have an aspect ratio between about 3 and about 10.

Figure 3A:
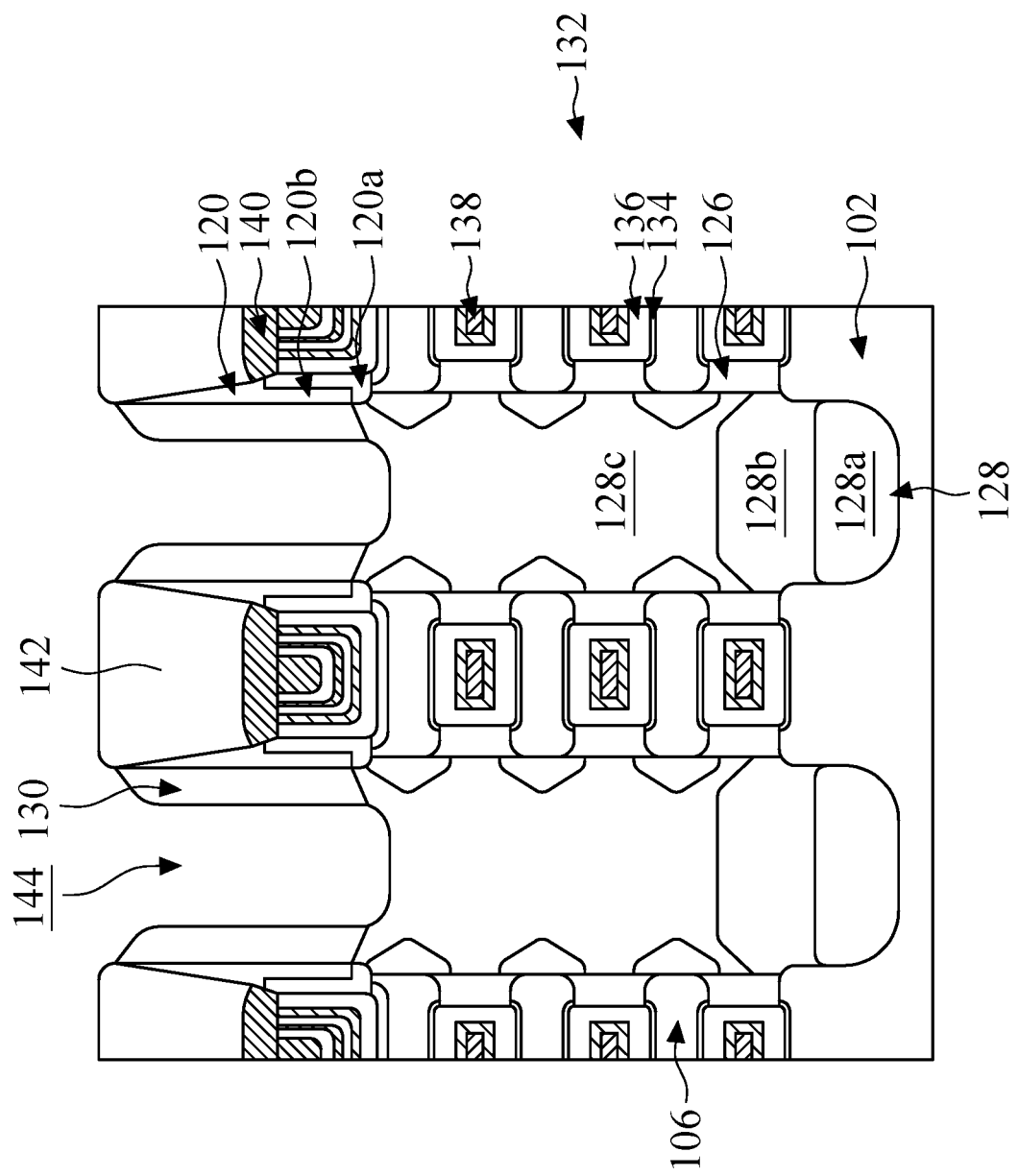
FIGS. 3A-3C are cross-sectional representations of various stages of forming a semiconductor device structure, in accordance with some embodiments of the disclosure.
Figure 3B:
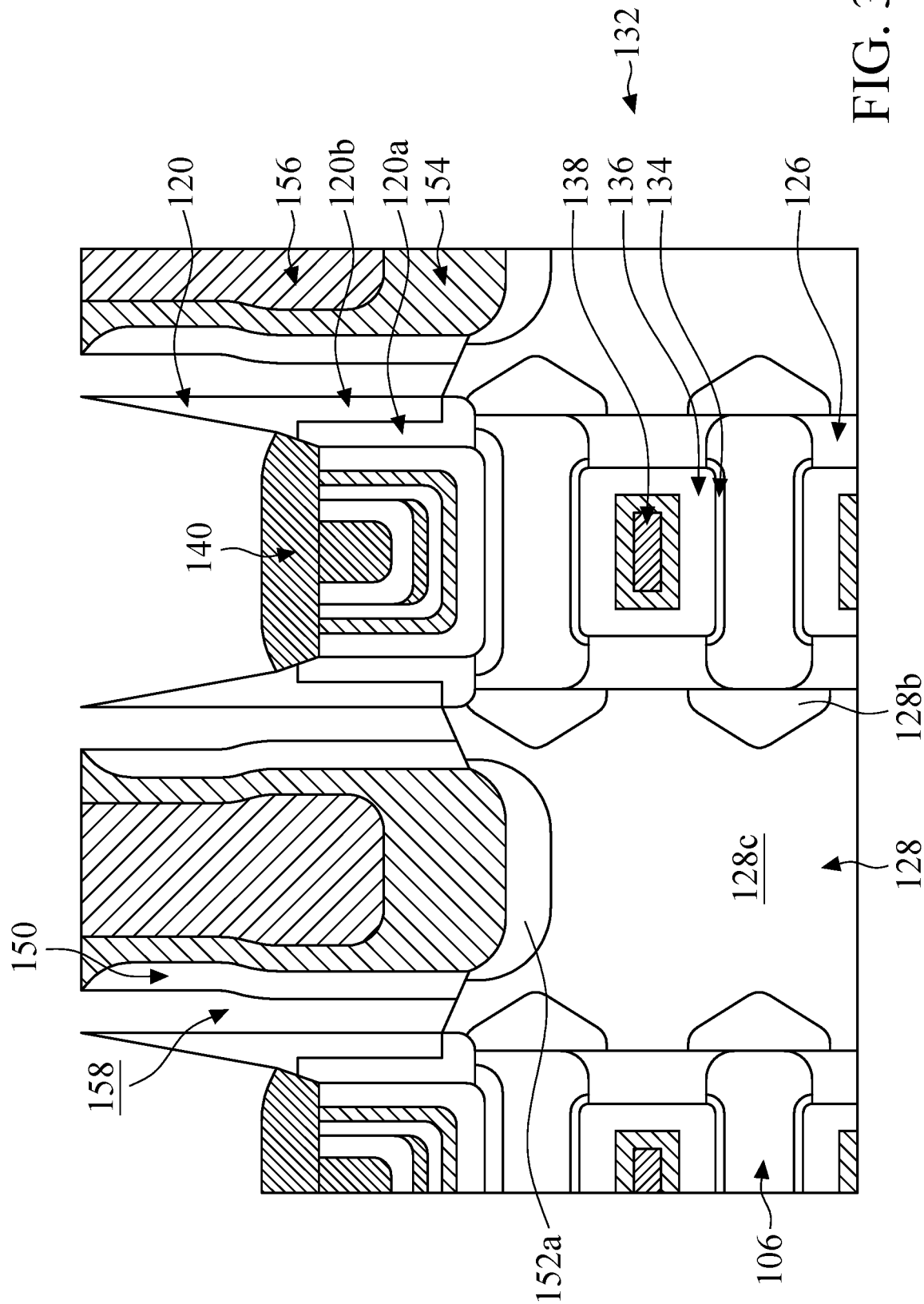
Figure 3C:
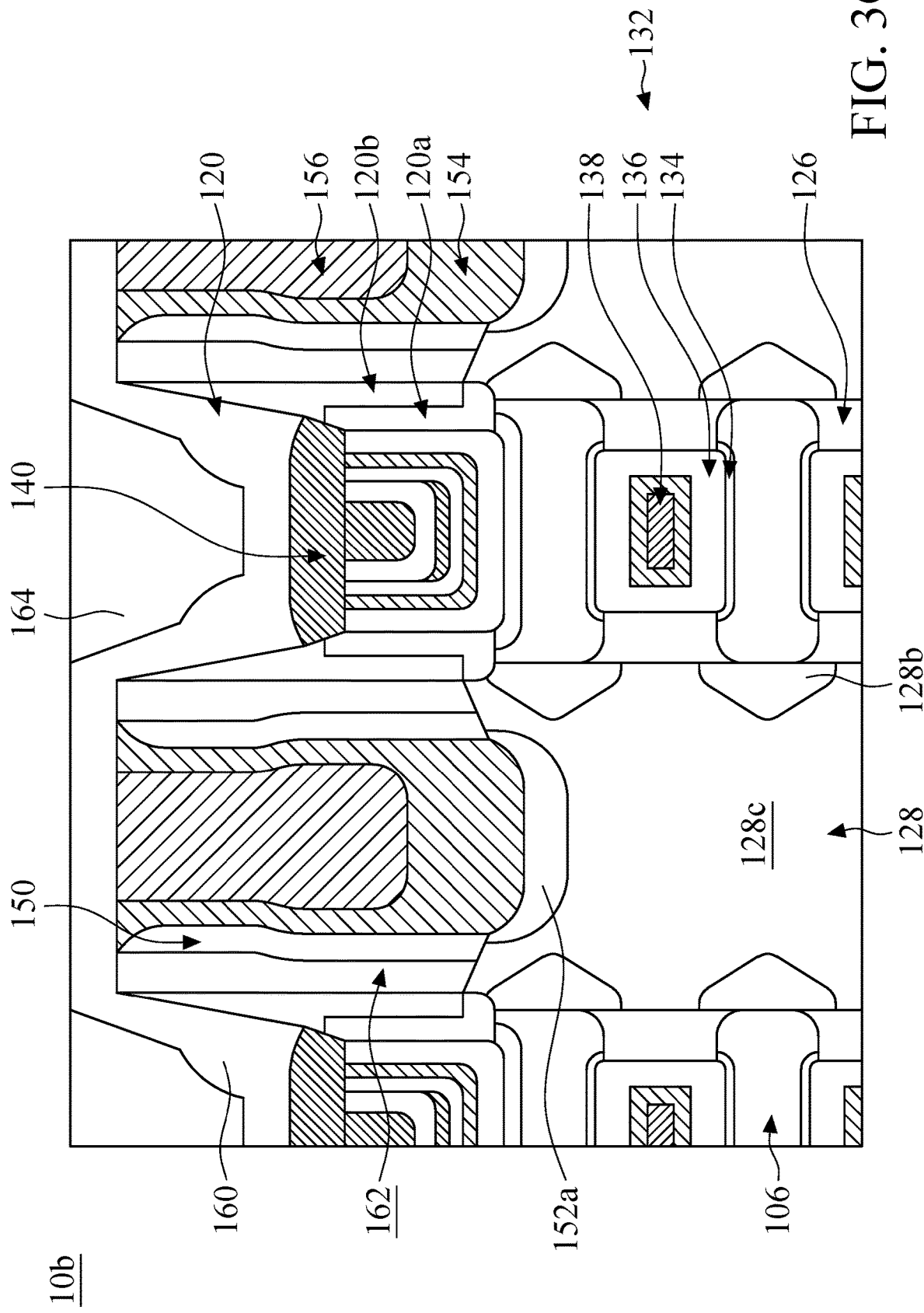

Many variations and/or modifications may be made to the embodiments of the disclosure. FIGS. 3A-3C are cross-sectional representations of various stages of forming a semiconductor device structure 10b (shown in FIG. 3C), in accordance with some embodiments of the disclosure. Some processes or devices are the same as, or similar to, those described in the embodiments above, and therefore the descriptions of these processes and devices are not repeated herein. As compared to the embodiments described above in conjunction with FIGS. 2A-2J, one of the discernible differences is that, as shown in FIG. 3A, the spacer layer 120 extends higher.

In some embodiments, after forming the hard mask layer 142 over the gate structure 132, the remaining spacer layer 120 extends higher. In some embodiments, the top surface of the spacer layer 120 is substantially level with the top surface of the hard mask layer 142.

In some embodiments, the carbon content of the spacer layer 120 in semiconductor device structure 10b may be higher. Therefore, the material of the spacer layer 120 may etch slower and the spacer layer 120 may be taller after forming the recess over the gate structure 132. In these embodiments, the spacer layer 120 may be made of SiCN, SiC, other applicable materials, or a combination thereof. The carbon content of the spacer layer 120 may be increased by carbon-containing gas or carbon doping.

Due to the taller spacer layer 120, the trench 158 is deeper after removing the hard mask layer 142 and the dummy layer 148, as shown in FIG. 3B in accordance with some embodiments. In other words, the trench 158 may have a greater aspect ratio than that of the trench 158 in FIG. 2H. In some embodiments, the top surface of spacer layer 120 is substantially level with the top surface of the contact structure 156.

Next, the air spacer 162 is formed after forming the seal liner layer 160, as shown in FIG. 3C in accordance with some embodiments. Since the trench 158 is deeper, the air spacer 162 may be higher. The parasitic capacitance may be further decreased with a higher air spacer 162. In some embodiments, the air spacer 162 is higher than the gate structure 132. In some embodiments, the air spacer 162 is substantially as high as the contact plug 156. If the air spacer 162 is higher than the contact plug 156, the air spacer 162 may not be sealed during the subsequent etching process.

It should be noted that, although the air spacer 162 is substantially as high as the contact plug 156 as shown in FIG. 3C, the height of the air spacer 162 is not limited herein and may be greater or smaller depending on the design of the semiconductor device structure 10b. In the embodiments represented in FIG. 3C, the air spacer 162 may have a width between about 1 nm and about 10 nm and a height between about 30 nm and about 50 nm. In these embodiments, the air spacer 162 may have an aspect ratio between about 5 and about 30. The carbon composition of the spacer layer 120 may be modified to meet the target height of the air spacer 162.

With the dummy layer 148 and the hard mask layer 142 over the gate structure 132 being formed of the same material, a trench 158 may be formed between the protection layer 150 and the spacer layer 120 after removing the dummy layer 148 and the hard mask layer 142. A seal liner layer 160 is deposited over the trench 158 and an air spacer 162 may be formed. With the air spacer 162 formed between the spacer layer 120 and the contact structure 156, the parasitic capacitance may be reduced. The height of the air spacer 162 and the parasitic capacitance may be modified by modifying the material hardness of the spacer layer 120.

Figure 4A:
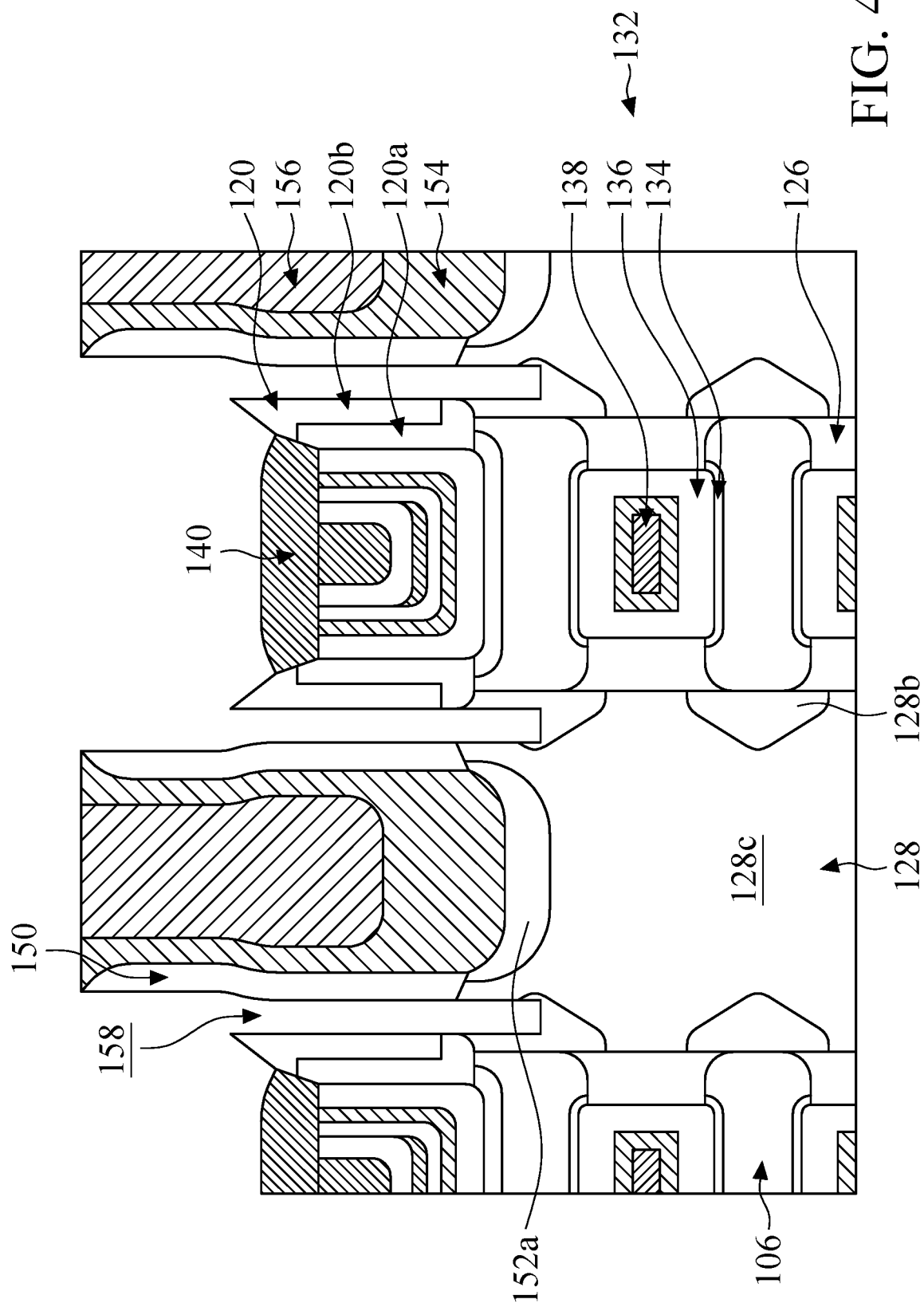
FIGS. 4A-4B are cross-sectional representations of various stages of forming a semiconductor device structure, in accordance with some embodiments of the disclosure.
Figure 4B:
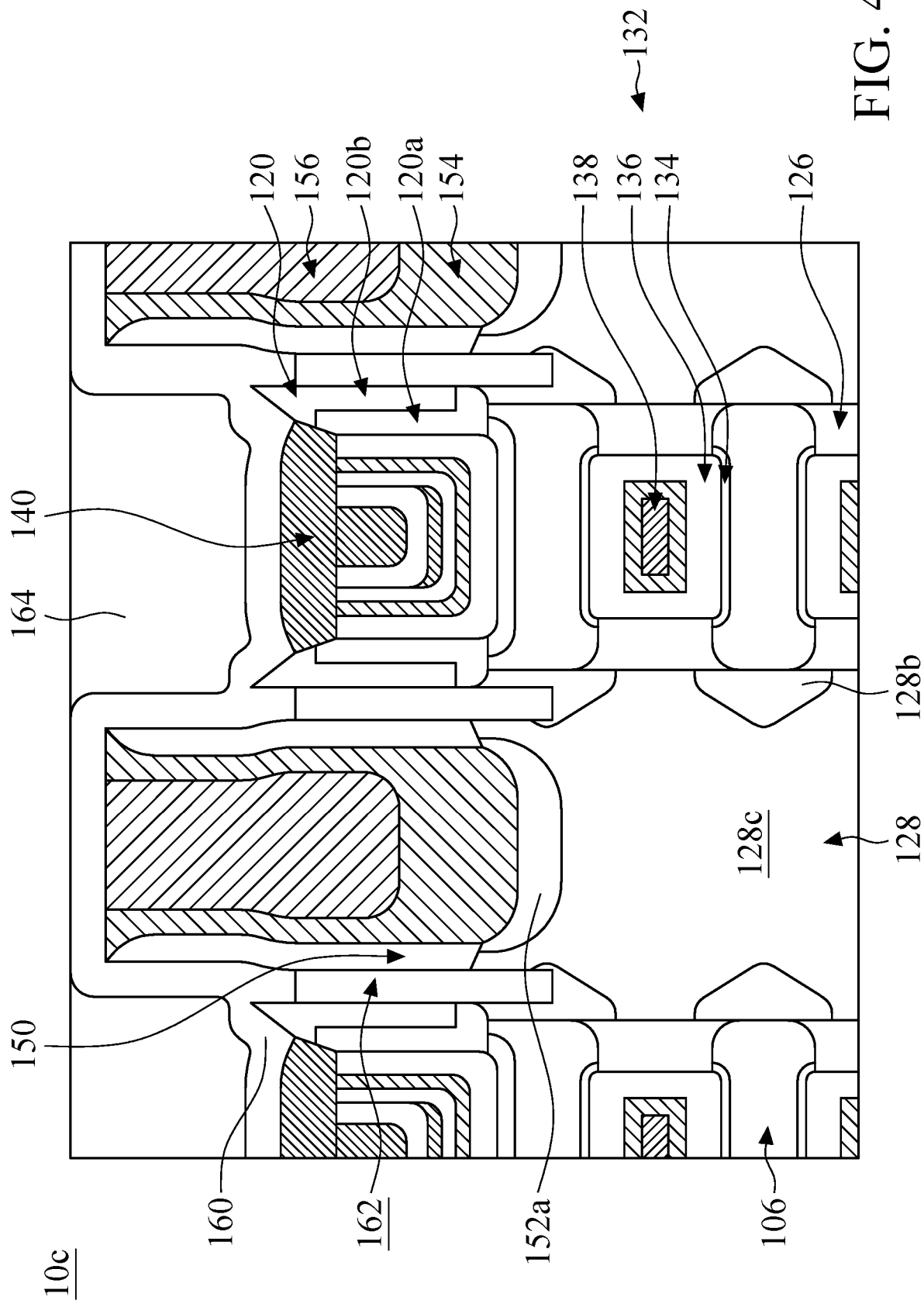

Many variations and/or modifications may be made to the embodiments of the disclosure. FIGS. 4A-4B are cross-sectional representations of various stages of forming a semiconductor device structure 10c, in accordance with some embodiments of the disclosure. Some processes or devices are the same as, or similar to, those described in the embodiments above, and therefore the descriptions of these processes and devices are not repeated herein. As compared to the embodiments described above in conjunction with FIGS. 2A-2J, one of the discernible differences is that, as shown in FIG. 4A, the trench 158 further extends into the source/drain epitaxial structure 128.

In some embodiments, the source/drain epitaxial structure 128 is further etched when forming the trench 158. In some embodiment, the edge portion 128b of the source/drain epitaxial structure 128 is etched. In some embodiments, the etching process include a dry etching process using an Ar-based or Cl-based etchant gas. In some embodiments, the etching process provides etching selectivity between the source/drain epitaxial structure 128 and the first silicide layer 152a. This is especially true because the dummy layer 148 and the hard mask layer 142 may both be formed of semiconductor material, like the source/drain epitaxial structure 128. Therefore, the first silicide layer 152a may not be damaged, and the resistance may not be increased. In addition, the second semiconductor layer 106 near the trench 158 also remains after the etching process.

Afterwards, an air spacer 162 is formed extending into the source/drain epitaxial structure 128. Since the total height of the air spacer 162 is greater, the parasitic capacitance may be reduced. In some embodiments, the bottom surface of the air spacer 162 is shallower or has the same depth with the bottom surface of the first silicide layer 152a. If the air spacer 162 further extends into the source/drain epitaxial structure 128 than the bottom surface of the first silicide layer 152a, the parasitic capacitance may not be further reduced. In the embodiments represented in FIG. 4B, the air spacer 162 may have a width between about 1 nm and about 10 nm and a height between about 15 nm and about 35 nm. In these embodiments, the air spacer 162 may have an aspect ratio between about 3.5 and about 15.

With forming the dummy layer 148 and the hard mask layer 142 over the gate structure 132 by the same material, a trench 158 may be formed between the protection layer 150 and the spacer layer 120 after removing the dummy layer 148 and the hard mask layer 142. A seal liner layer 160 is deposited over the trench 158 and an air spacer 162 may be formed. With the air spacer 162 formed between the spacer layer 120 and the contact structure 156, the parasitic capacitance may be reduced. While allowing the air spacer 162 to extend further into the source/drain epitaxial structure 128 may further reduce the parasitic capacitance, such overly downward extending air spacer 162 may disable to the topmost channel region 206.

Figure 5A:
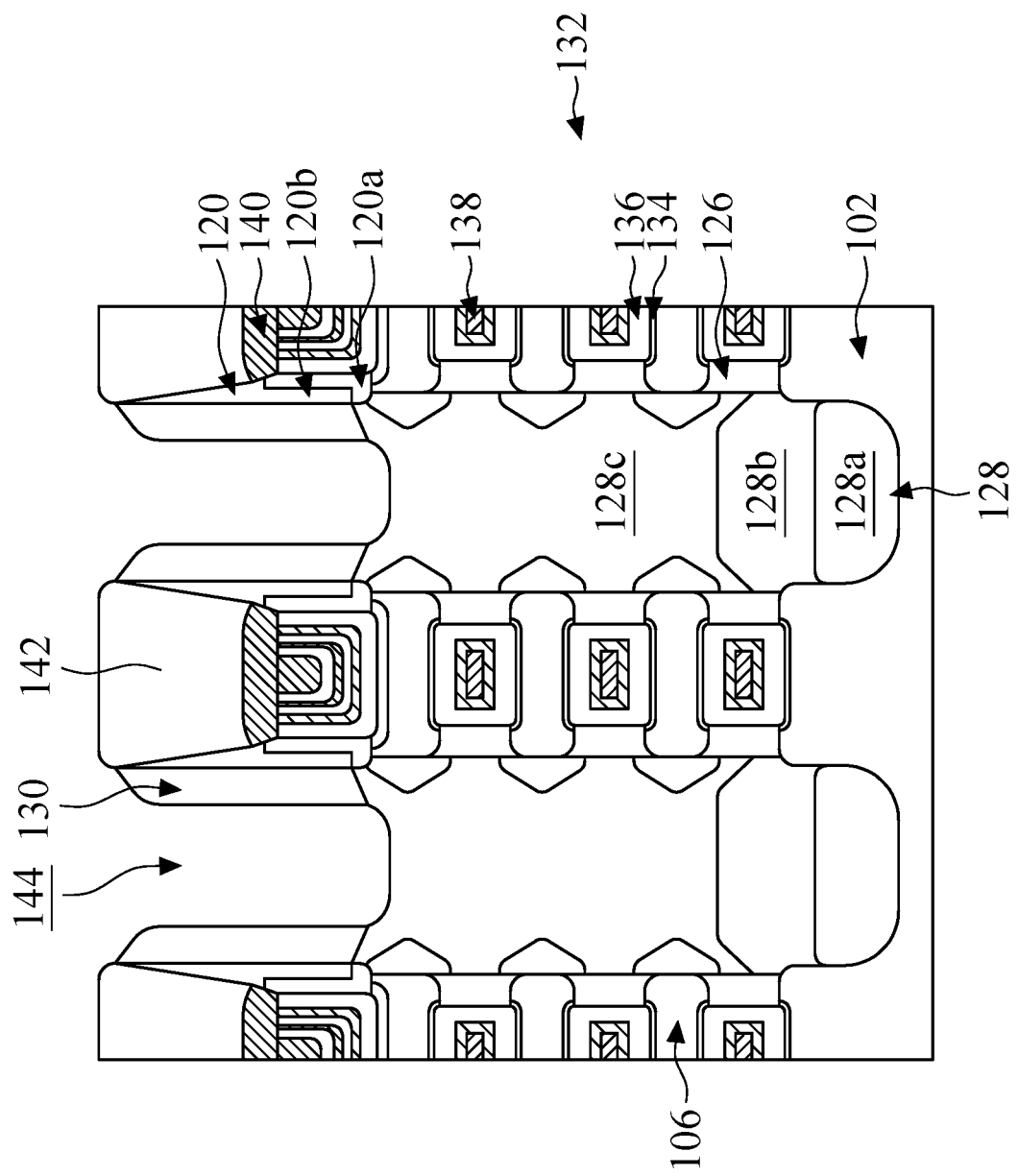
FIGS. 5A-5C are cross-sectional representations of various stages of forming a semiconductor device structure, in accordance with some embodiments of the disclosure.
Figure 5B:
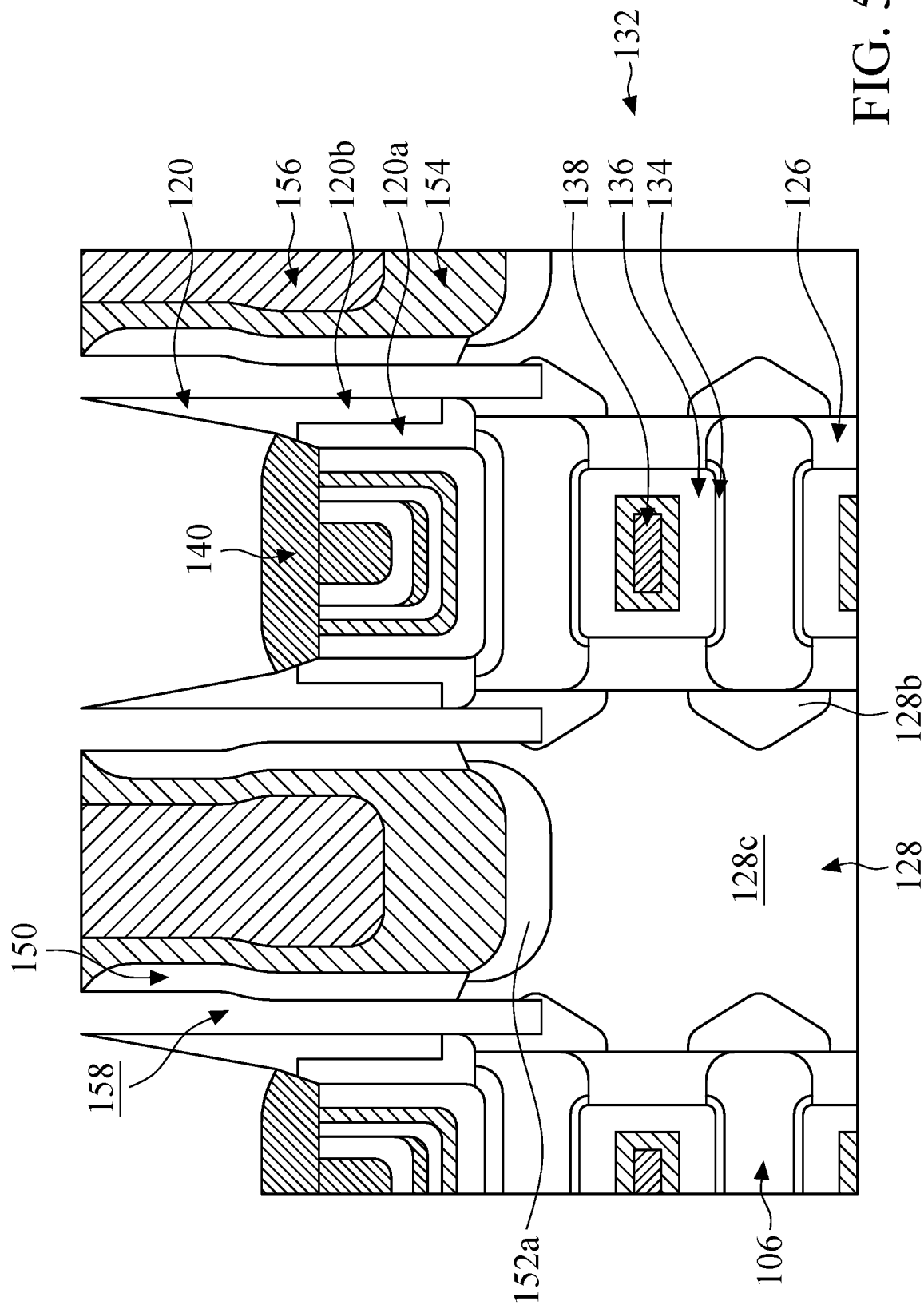
Figure 5C:
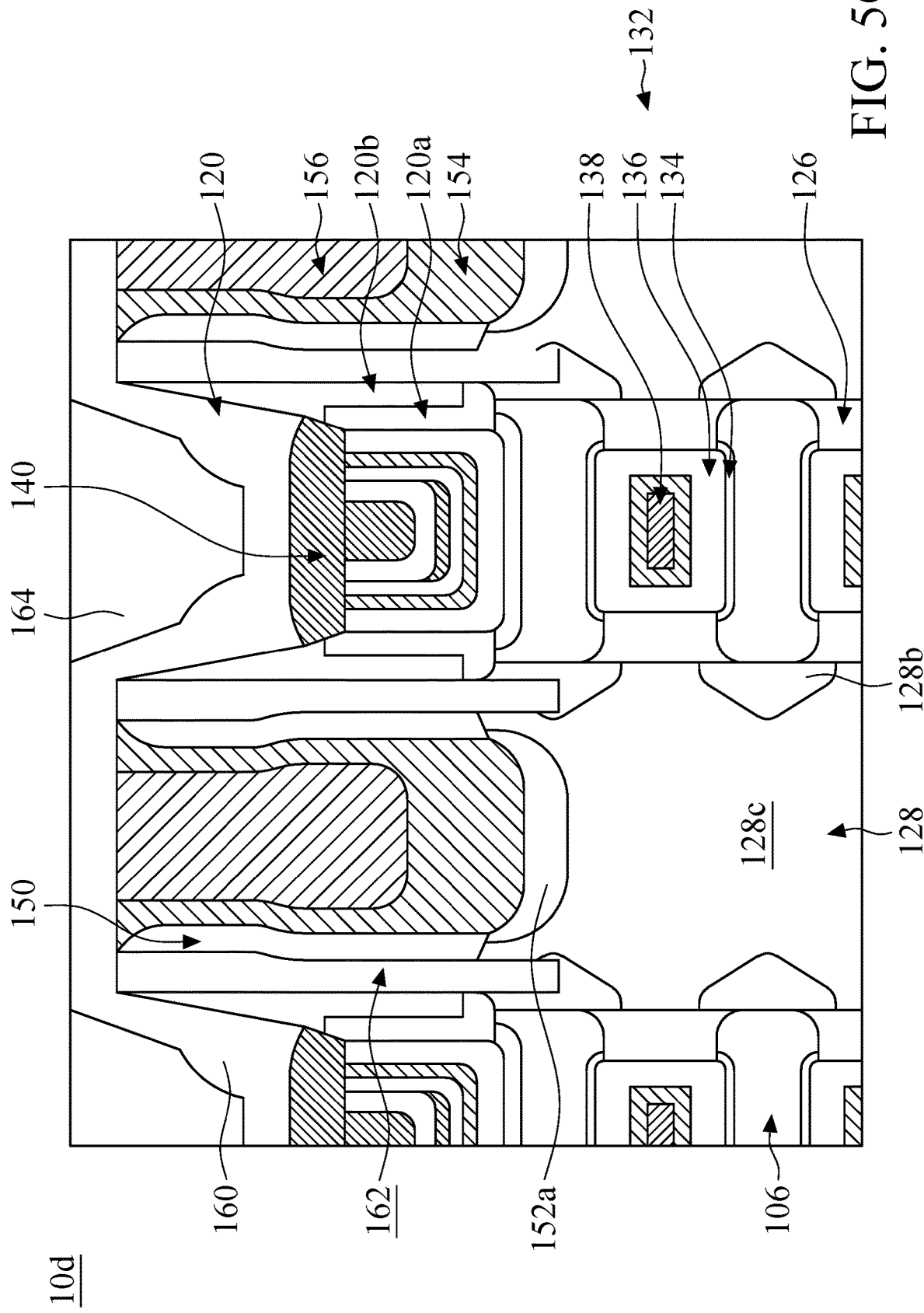

Many variations and/or modifications may be made to the embodiments of the disclosure. FIGS. 5A-5C are cross-sectional representations of various stages of forming a semiconductor device structure 10d (shown in FIG. 5C), in accordance with some embodiments of the disclosure. Some processes or devices are the same as, or similar to, those described in the embodiments above, and therefore the descriptions of these processes and devices are not repeated herein. As compared to the embodiments described above in conjunction with FIGS. 2A-2J, one of the discernible differences is that, as shown in FIGS. 5A and 5B, the top surface of the air spacer 162 is higher and the air spacer 162 further extends into source/drain epitaxial structure 128. In the embodiments represented in FIG. 5C, the air spacer 162 may have a width between about 1 nm and about 10 nm and a height between about 35 nm and about 55 nm. In these embodiments, the air spacer 162 may have an aspect ratio between about 5.5 and about 3.5.

The spacer layer 120 may be made of harder material (i.e., slower-etching material), and the spacer layer 120 is higher when forming the hard mask layer 142, as shown in FIG. 5A in accordance with some embodiments. Later, the trench 158 is further etched into the source/drain epitaxial structure 128, as shown in FIG. 5B in accordance with some embodiments. Therefore, in some embodiments, the air spacer 162 is higher than the gate structure 132. In some embodiments, the top surface of the air spacer 162 is higher than the top surface of the gate structure 132, and the bottom surface of the air spacer 162 is lower than the bottom surface of the gate structure 132.

By combining the features of the embodiments shown in FIGS. 3A-3C and 4A-4B, the resulting air spacer 162 is higher, as shown in FIG. 5A in accordance with some embodiments. Therefore, the parasitic capacitance may be further reduced.

With the dummy layer 148 and the hard mask layer 142 over the gate structure 132 being formed of the same material, a trench 158 may be formed between the protection layer 150 and the spacer layer 120 after removing the dummy layer 148 and the hard mask layer 142. A seal liner layer 160 is deposited over the trench 158 and an air spacer 162 may be formed. With the air spacer 162 formed between the spacer layer 120 and the contact structure 156, the parasitic capacitance may be reduced. With spacer layer 120 made of harder material and further etching the source/drain epitaxial structure 128 through the trench 158, the air spacer 162 may be higher, and the parasitic capacitance may be further reduced.

Figure 6:
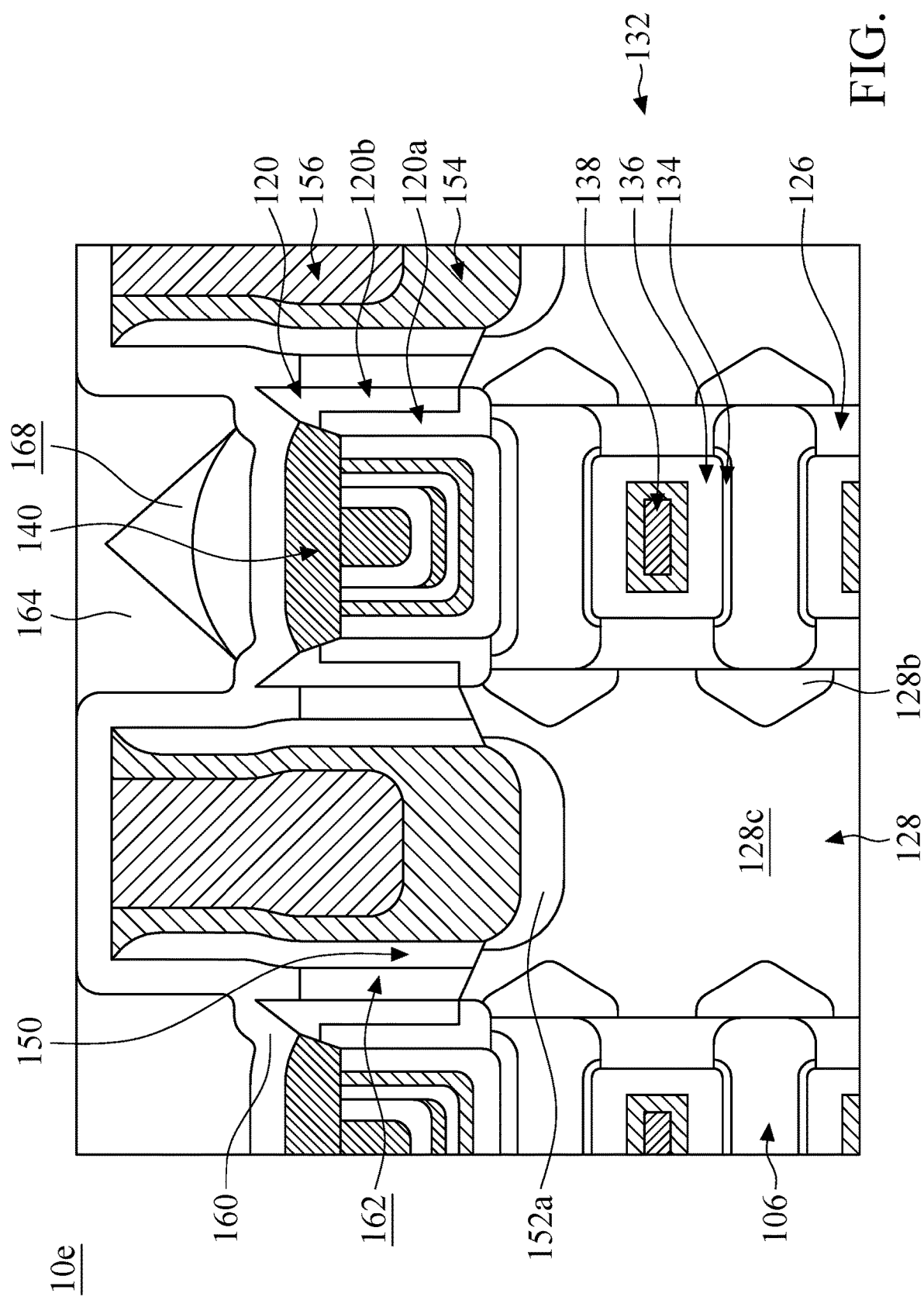
FIG. 6 is a cross-sectional representation of a semiconductor device structure, in accordance with some embodiments of the disclosure.

Many variations and/or modifications may be made to the embodiments of the disclosure. FIG. 6 is a cross-sectional representations of a semiconductor device structure 10e, in accordance with some embodiments of the disclosure. Some processes or devices are the same as, or similar to, those described in the embodiments above, and therefore the descriptions of these processes and devices are not repeated herein. As compared to the embodiments described above in conjunction with FIGS. 2A-2J, one of the discernible differences is that, as shown in FIG. 6, a void 168 is formed in the filling film 164.

In some embodiments, the filling film 164 may be formed by a PVD-like deposition process that has less hole filling capability such that the filling film 164 may merge prematurely, leaving behind the void 168 in the filling film 164. Example PVD-like deposition processes may include a PVD process or a CVD process. In order to form the void 168, the filling film 164 may not be formed using deposition techniques that have good hole filling capability, such ALD, FCVD, spin-on coating, or PECVD. The void 168 is formed over the gate structure 132 between adjacent contact structures 156. Therefore, the parasitic capacitance between adjacent contact structures 156 may be reduced by the void 168 in the filling film 164. In some embodiments, the void 168 is formed while forming the filling film 164.

In some embodiments, since the void 168 is formed due to the filling film 164 overhanging, the bottom portion of the void 168 is wider than the top portion of the void 168.

With the dummy layer 148 and the hard mask layer 142 over the gate structure 132 being formed of the same material, a trench 158 may be formed between the protection layer 150 and the spacer layer 120 after removing the dummy layer 148 and the hard mask layer 142. A seal liner layer 160 is deposited over the trench 158 and an air spacer 162 may be formed. With the air spacer 162 formed between the spacer layer 120 and the contact structure 156, the parasitic capacitance may be reduced. A void 168 may be formed in the filling layer 164, and the parasitic capacitance between adjacent contact structures 156 may be reduced.

Figure 7A:
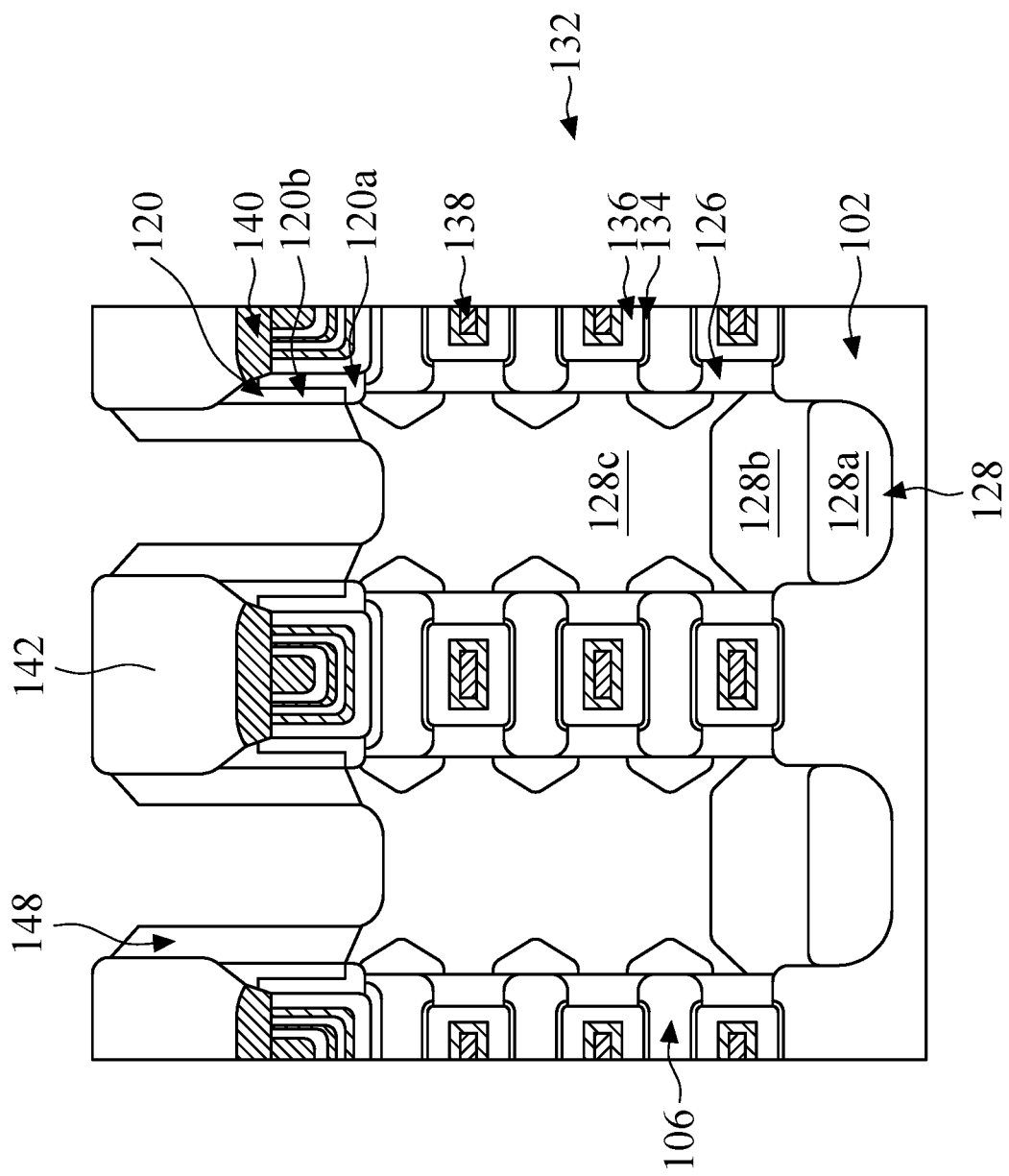
FIGS. 7A-7F are cross-sectional representations of various stages of forming a semiconductor device structure, in accordance with some embodiments of the disclosure.

Many variations and/or modifications may be made to the embodiments of the disclosure. FIGS. 7A-7F are cross-sectional representations of various stages of forming a semiconductor device structure 10f (shown in FIG. 7F), in accordance with some embodiments of the disclosure. Some processes or devices are the same as, or similar to, those described in the embodiments above, and therefore the descriptions of these processes and devices are not repeated herein. As compared to the embodiments described above in conjunction with FIGS. 2A-2J, one of the discernible differences is that, as shown in FIG. 7A, the dummy layer 148 is thicker, and the protection layer 150 is not formed over the sidewall of the dummy layer 148.

Figure 7B:
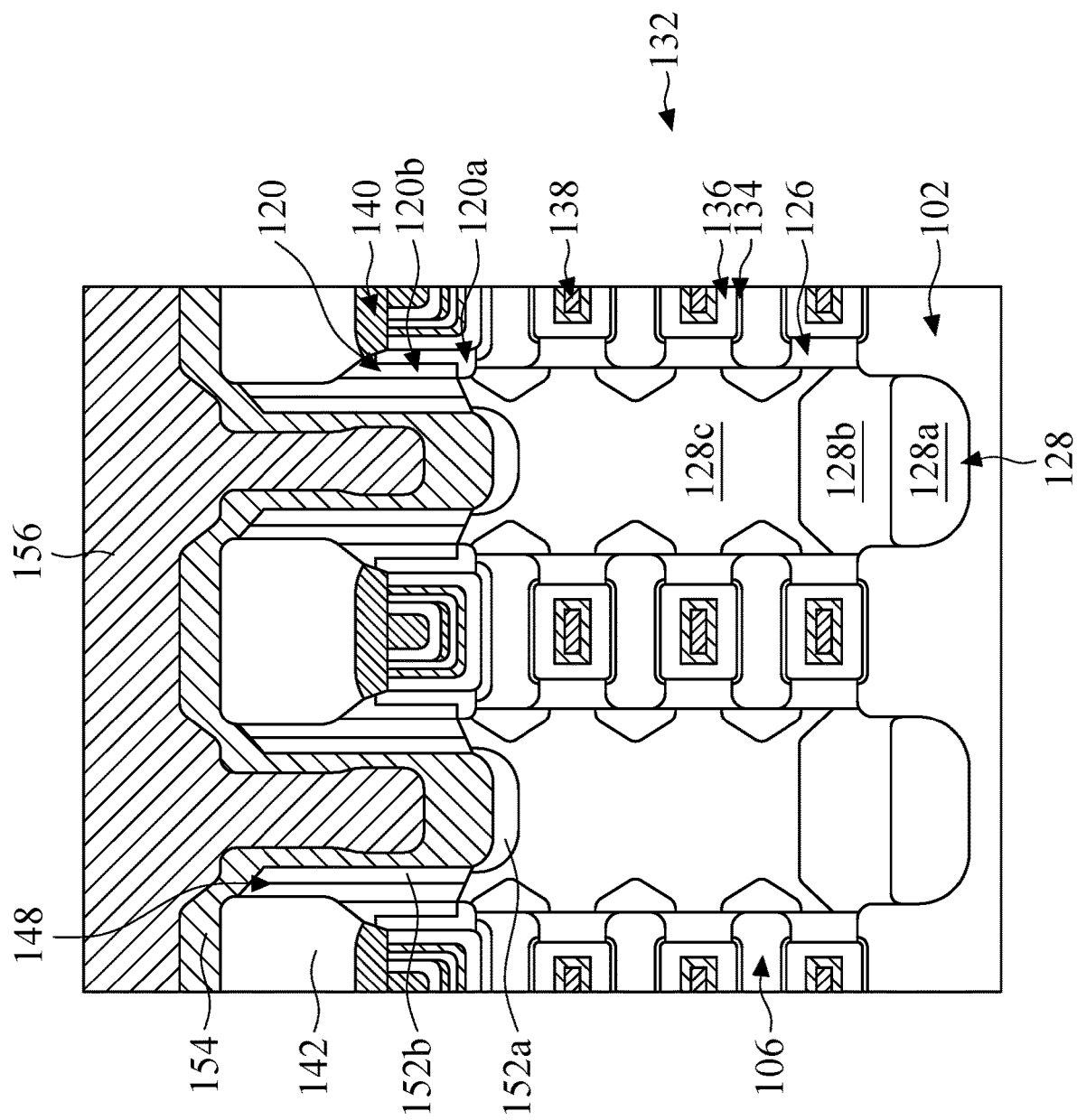

Next, while the first silicide layer 152a is formed over the source/drain epitaxial structure 128 by the annealing step in the silicide process, the second silicide layer 152b is formed over the sidewall of the dummy layer 148 when the dummy layer 148 is formed of a semiconductor material (such as Si, Ge, or SiGe), as shown in FIG. 7B in accordance with some embodiments. The second silicide layer 152b may be a second metal semiconductor layer 152b and may have a composition similar to or different than that of the first silicon layer 152a. When the compositions of the dummy layer 148 and the source/drain features 128 are the same, the first silicide layer 152a and the second silicide layer 152b may have the same composition. When the compositions of the dummy layer 148 and the source/drain features 128 are different, the first silicide layer 152a and the second silicide layer 152b may have different compositions. In some embodiments, the second silicide layer 152b is only formed over the surface of the dummy layer 148 near the contact structure 156. In some embodiments, the second silicide layer 152b is formed along sidewalls of the dummy layer 148 and is in contact with the contact structure 156. In some embodiments, the dummy layer 148 near the gate structure 132 remains.

In some embodiments, the anneal temperature of the annealing step in the silicide process when forming the first silicide layer 152a and the second silicide layer 152b is in a range of about 400° C. to about 800° C. In some embodiments, the anneal duration of the annealing step in the silicide process forming the first silicide layer 152a and the second silicide layer 152b is in a range of about 30 seconds to about 10 minutes.

Figure 7C:
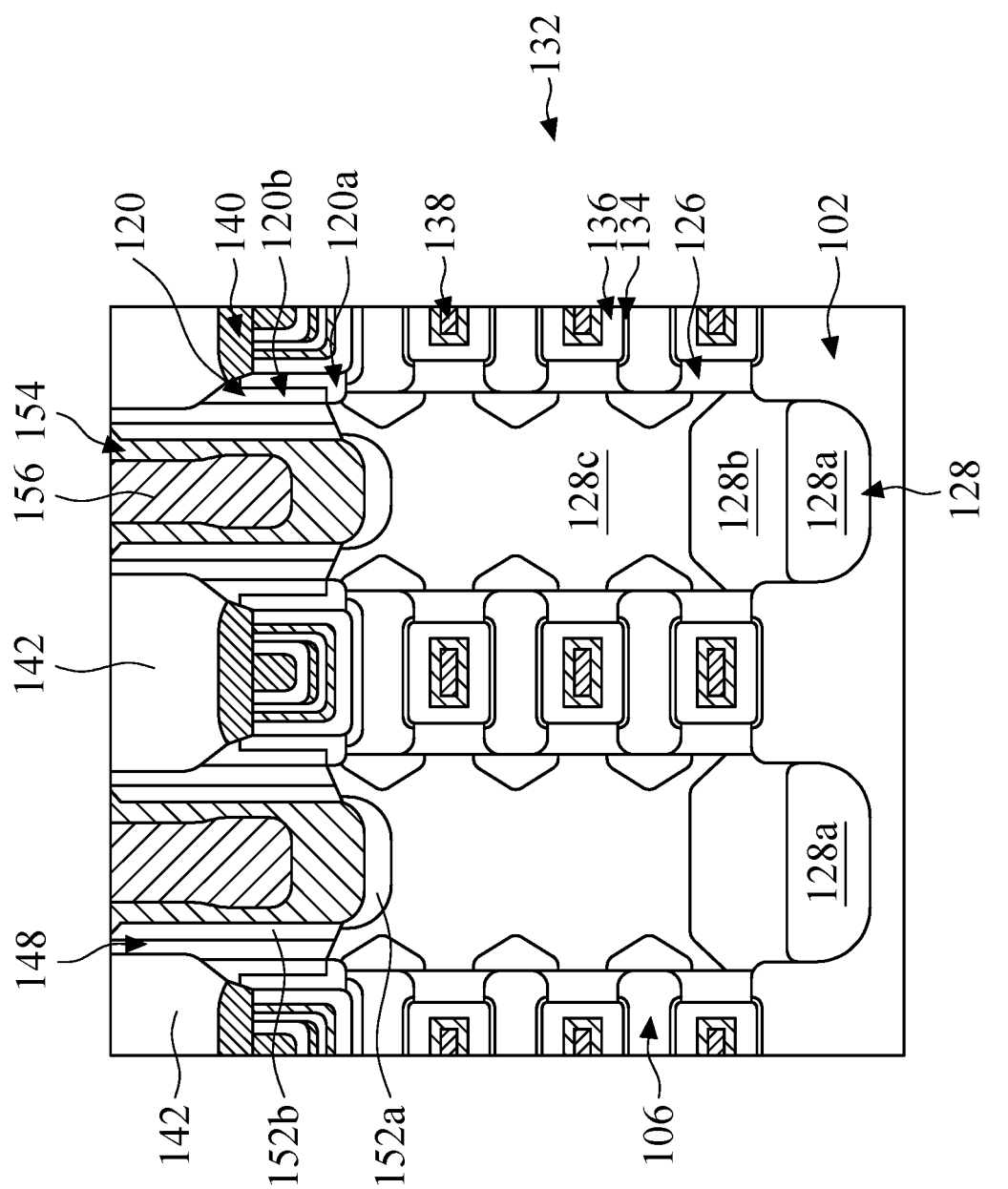

Next, after a planarization process, the contact structure 156 is formed beside the second silicide layer 152b, as shown in FIG. 7C in accordance with some embodiments. The top surface of the hard mask 142 may be exposed after the planarization process. After the planarization process, the top surface of the contact structure 156 may be level with the top surfaces of the hard mask layer 142, the dummy layer 148, and the second silicide layer 152b. The planarization process may be the same as, or similar to, the planarization process in the previous embodiments. For the purpose of brevity, the descriptions of these processes are not repeated herein.

Figure 7D:
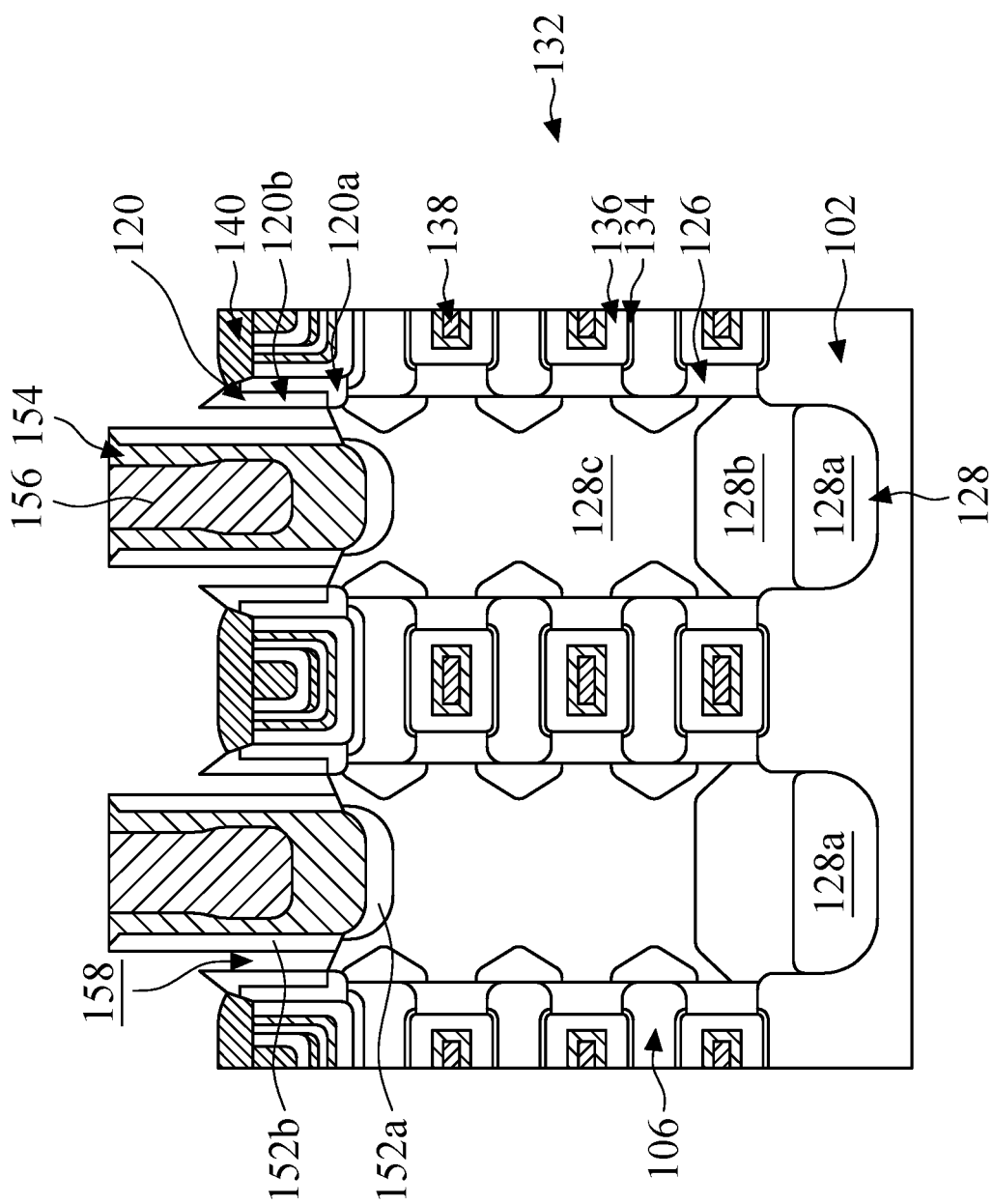

Next, the hard mask layer 142 and the dummy layer 148 are removed, and a trench 158 is formed between the spacer layer 120 and the second silicide layer 152b, as shown in FIG. 7D in accordance with some embodiments. In some embodiments, the sidewalls of the spacer layer 120 and the second silicide layer 152b and a portion of the top surface of the source/drain epitaxial structure 128 are exposed from the trench 158. The removing process may be the same as, or similar to, the removing process in the previous embodiments. For the purpose of brevity, the descriptions of these processes are not repeated herein.

Figure 7E:
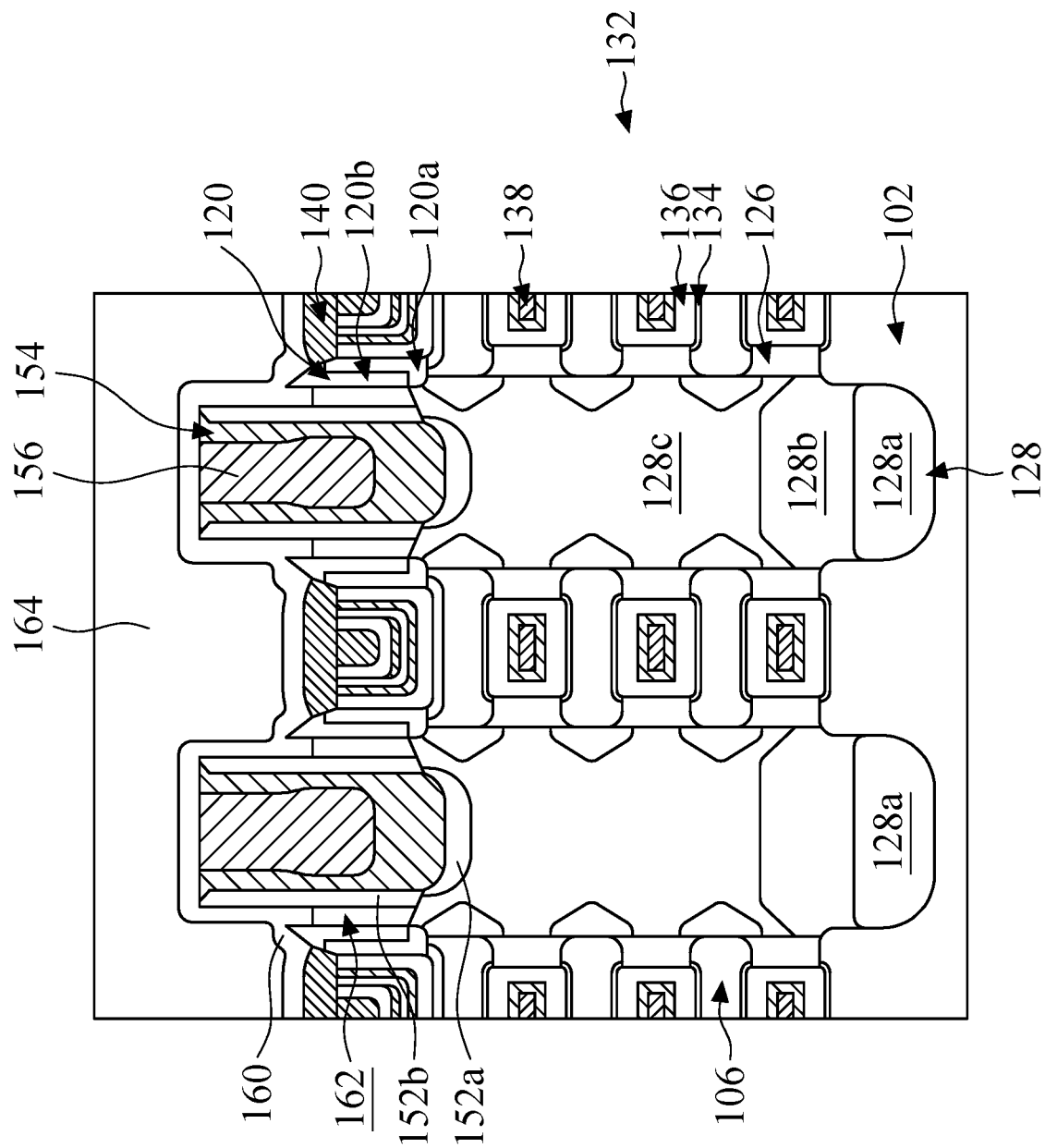

Next, a seal liner layer 160 is formed over the gate structure 132 and the contact structure 156, as shown in FIG. 7E in accordance with some embodiments. In some embodiments, the trench 158 is sealed, and an air spacer 162 is formed under the seal liner layer 160 between the spacer layer 120 and the second silicide layer 152b, as shown in FIG. 7E in accordance with some embodiments. The processes for forming the seal liner layer 160 may be the same as, or similar to, the forming process of forming the seal liner layer 160 in the previous embodiments. For the purpose of brevity, the descriptions of these processes are not repeated herein.

Figure 7F:
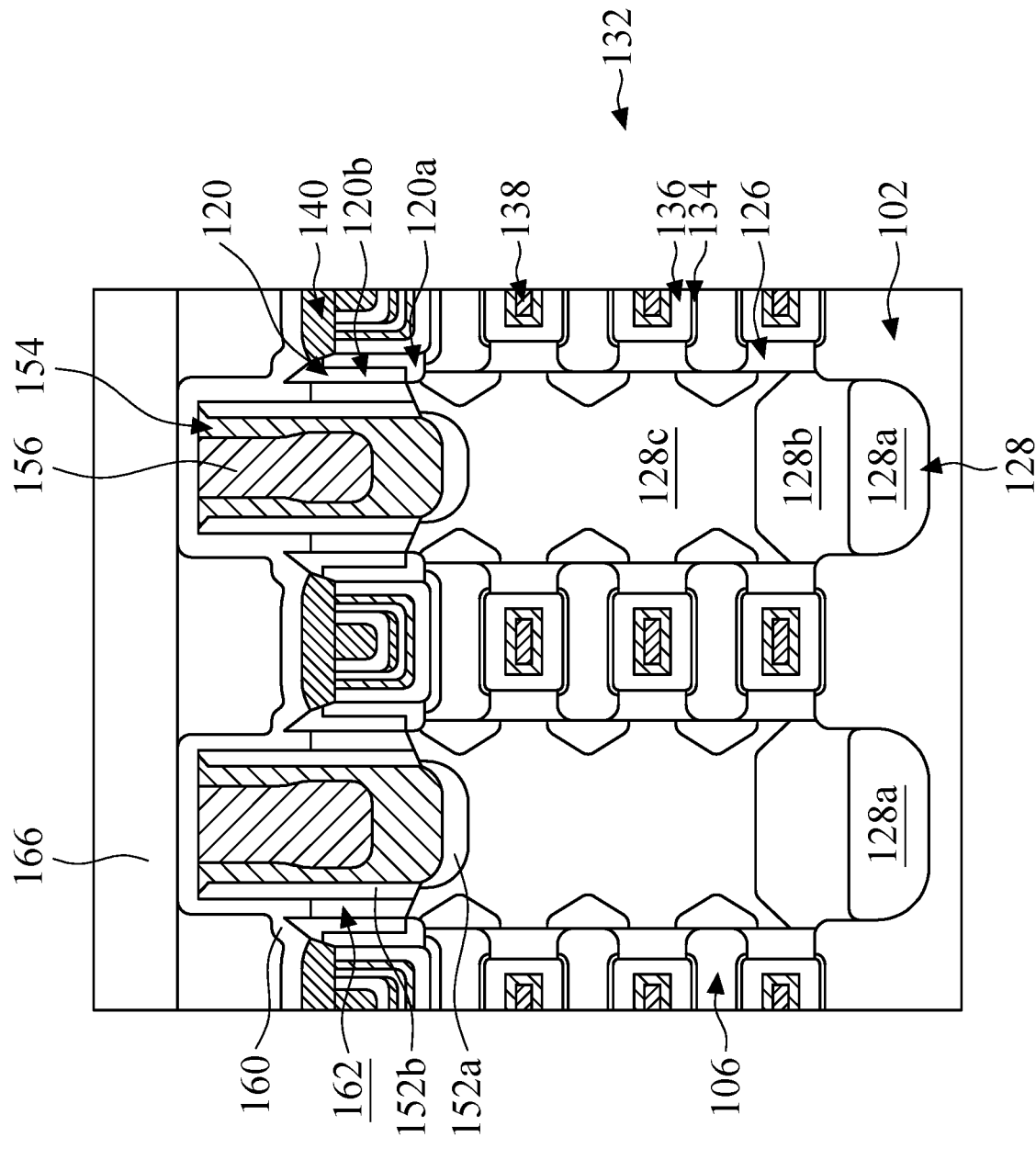

Afterward, a filling film 164 is filled in over the seal liner layer 160, as shown in FIG. 7E in accordance with some embodiments. Later, a planarization process is performed over the filling film 164 until the top surface of the seal liner layer 160 is exposed, as shown in FIG. 7F in accordance with some embodiments. Next, a second contact etch stop layer 166 is formed over the filling film 164 and the seal liner layer 160, as shown in FIG. 7F in accordance with some embodiments. The processes for forming the filling film 164 and the second contact etch stop layer 166 may be the same as, or similar to, the forming process of forming the filling film 164 and the second contact etch stop layer 166 in the previous embodiments. For the purpose of brevity, the descriptions of these processes are not repeated herein.

With the dummy layer 148 and the hard mask layer 142 over the gate structure 132 being formed of the same material, a trench 158 may be formed between the protection layer 150 and the spacer layer 120 after removing the dummy layer 148 and the hard mask layer 142. A seal liner layer 160 is deposited over the trench 158 and an air spacer 162 may be formed. With the air spacer 162 formed between the spacer layer 120 and the contact structure 156, the parasitic capacitance may be reduced. Thicker dummy layer 148 may react in the silicide process, and the second silicide layer 152b may be formed in the dummy layer 148 near the contact structure 156. The second silicide layer 152b may replace the protection layer 150. Therefore, the process of forming the protection layer 150 may be skipped, and the production time and cost may be reduced.

As previously described, an air spacer 162 is formed between the spacer layer 120 and the contact structure 156, and the parasitic capacitance may be reduced. With the dummy layer 148 beside the spacer layer 120 and the hard mask layer 142 over the gate structure 132 being formed of the same material, the dummy layer 148 and the hard mask layer 142 may be removed in the same process, and the height difference between the dummy layer 148 and the hard mask layer 142 may help form the air spacer 162 when depositing the seal liner layer 160. In some embodiments as shown in FIG. 3C, the height of the air spacer 162 is increased by increasing the etch resistance of the spacer layer 120. With a taller air spacer 162, the parasitic capacitance is further decreased. In some embodiments as shown in FIG. 4B, the air spacer 162 extends into to source/drain epitaxial structure 128, and the height of the air spacer 162 is increased. In some embodiments as shown in FIG. 5C, the etch resistance of the spacer layer 120 increases and the source/drain epitaxial structure 128 is further etched, so the total height of the air spacer 162 further increases. In some embodiments as shown in FIG. 6, a void 168 is formed in the filling film 164. The parasitic capacitance between the contact structures 156 is reduced by the void 168. In some embodiments as shown in FIG. 7A, the air spacer is formed between the spacer layer 120 and a second silicide layer 152b, which is formed along sidewalls of the dummy layer 148 near the contact structure 156.

Embodiments of a semiconductor device structure and a method for forming the same are provided. The method for forming the semiconductor device structure may include depositing a seal liner layer over the gate structure and the contact structure, and an air spacer is formed between the spacer layer and the protection layer. With the air spacer, the parasitic capacitance may be reduced.

In some embodiments, a semiconductor device structure is provided. The semiconductor device structure includes nanostructures formed over a substrate. The semiconductor device structure also includes a gate structure formed over and around the nanostructures. The semiconductor device structure further includes a spacer layer formed over a sidewall of the gate structure over the nanostructures. The semiconductor device structure further includes a source/drain epitaxial structure formed adjacent to the spacer layer. The semiconductor device structure further includes a contact structure formed over the source/drain epitaxial structure with an air spacer formed between the spacer layer and the contact structure.

In some embodiments, a semiconductor device structure is provided. The semiconductor device structure includes a fin structure formed over a substrate. The semiconductor device structure also includes nanostructures formed over the fin structure. The semiconductor device structure further includes a gate structure wrapped around the nanostructures. The semiconductor device structure further includes spacer layers formed over opposite sides of the gate structure above the nanostructures. The semiconductor device structure further includes source/drain epitaxial structures formed over opposite sides of the nanostructures. The semiconductor device structure further includes contact structures formed over the source/drain epitaxial structures. The semiconductor device structure further includes a protection layer formed over sidewalls of the contact structures with an air spacer formed between the spacer layers and the protection layer.

In some embodiments, a method for forming a semiconductor device structure is provided. The method for forming a semiconductor device structure also includes forming nanostructures over a substrate. The method for forming a semiconductor device structure further includes forming a gate structure surrounding and over the nanostructures. The method for forming a semiconductor device structure further includes forming spacer layers over opposite sides of the gate structure over the nanostructures. The method for forming a semiconductor device structure further includes forming a dummy layer over sidewalls of the spacer layers. The method for forming a semiconductor device structure further includes forming contact structures beside the gate structure. The method for forming a semiconductor device structure further includes removing the dummy layer to form an air spacer between the spacer layers and the contact structures. The method for forming a semiconductor device structure further includes depositing a sealing liner layer over the gate structure, the contact structure, and the air spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   nanostructures formed over a substrate;
   a gate structure formed over and around the nanostructures;
   a spacer layer formed over a sidewall of the gate structure over the nanostructures;
   a source/drain epitaxial structure comprising an edge portion interfacing sidewalls of the nanostructures and a center portion over the edge portion;
   a contact structure formed over the source/drain epitaxial structure; and
   an air spacer disposed directly over the source/drain epitaxial structure and between the spacer layer and the contact structure,
   wherein the edge portion and the center portion are doped and a dopant concentration in the edge portion is smaller than a dopant concentration in the center portion,
   wherein the air spacer continuously and vertically extends into the source/drain epitaxial structure such that a portion of the edge portion and a portion of the center portion are exposed in the air spacer.

2. The semiconductor device structure as claimed in claim 1, further comprising:
   a protection layer formed over sidewalls of the contact structure,
   wherein the air spacer is disposed between the protection layer and the gate structure.

3. The semiconductor device structure as claimed in claim 1, further comprising:
   a seal liner layer deposited over the gate structure and the contact structure,
   wherein the seal liner layer is deposited over the air spacer.

4. The semiconductor device structure as claimed in claim 1, wherein the air spacer is higher than the gate structure.

5. The semiconductor device structure as claimed in claim 1, wherein the air spacer extends into the source/drain epitaxial structure.

6. The semiconductor device structure as claimed in claim 1, wherein a top surface of the air spacer is higher than a top surface of the gate structure, and a bottom surface of the air spacer is lower than a bottom surface of the gate structure.

7. The semiconductor device structure as claimed in claim 1, wherein a top surface of the air spacer is lower than a top surface of the contact structure.

8. A semiconductor device structure, comprising:
   a fin structure formed over a substrate and extending lengthwise along a direction;
   nanostructures formed over the fin structure;
   a gate structure wrapped around the nanostructures and comprising an interfacial layer interfacing the nanostructures and a gate dielectric layer over the interfacial layer;
   an inner spacer layer and an outer spacer layer formed over opposite sides of the gate structure above the nanostructure, wherein the inner spacer layer interfaces the gate dielectric layer, a sidewall of the outer spacer layer is spaced apart from the gate dielectric layer along the direction by the inner spacer layer, and a bottom surface of the outer spacer layer is spaced apart from a topmost nanostructure of the nanostructures by the inner spacer layer;

source/drain epitaxial structures formed over opposite sides of the nanostructures;

contact structures formed over the source/drain epitaxial structures;

a protection layer formed over sidewalls of the contact structures; and an air spacer disposed between the outer spacer layer and the protection layer such that the air spacer is disposed directly over the source/drain epitaxial structures.

9. The semiconductor device structure as claimed in claim 8, further comprising:

a seal liner layer covering the gate structure, the air spacer and the contact structures, wherein the seal liner layer and the protection layer are made of different materials.

10. The semiconductor device structure as claimed in claim 8, wherein a top surface of the air spacer is lower than a top surface of the outer spacer layer.

11. The semiconductor device structure as claimed in claim 8, further comprising:

a first silicide layer formed over the source/drain epitaxial structures; and a second silicide layer formed over sidewalls of the contact structures, wherein the air spacer is between the second silicide layer and the outer spacer layer.

12. The semiconductor device structure as claimed in claim 8, further comprising:

a filling film formed over the gate structure between the contact structures.

13. The semiconductor device structure as claimed in claim 12, further comprising:

a void disposed in the filling film.

14. A semiconductor structure, comprising:

a substrate;

a plurality of nanostructures disposed over the substrate and extending along a direction;

a source/drain feature disposed over the substrate and comprising an edge portion coupled to sidewalls of the plurality of nanostructures and a center portion spaced apart from the sidewalls of the plurality of nanostructures by the edge portion;

a gate structure wrapping around each of the plurality of nanostructures;

a contact structure disposed over and coupled to the source/drain feature;

a seal liner extending continuously from over a top surface of the gate structure to over a top surface of the contact structure; and a gap disposed over the source/drain feature and between the contact structure and the gate structure along the direction, wherein the edge portion and the center portion are strained and a strain in the edge portion is smaller than a strain in the center portion, wherein the gap continuously extends into the source/drain feature such that a portion of the edge portion and a portion of the center portion are exposed in the gap.

15. The semiconductor structure of claim 14, further comprising:

at least one gate spacer disposed over the plurality of nanostructures and along a sidewall of the gate structure.

16. The semiconductor structure of claim 15, wherein the gap is disposed between the at least one gate spacer and the contact structure along the direction.

17. The semiconductor structure of claim 15, further comprising:

a protective layer extending along a sidewall of the contact structure.

18. The semiconductor structure of claim 17, wherein the gap is disposed between the at least one gate spacer and the protective layer along the direction.

19. The semiconductor structure of claim 17, wherein the protective layer composes silicon oxide, silicon nitride, TiN, LaO, AlO, YO, TaCN, SiOCN, SiOC, SiCN, LaO, ZrN, ZrAlO, TiO, TaO, ZrO, HfO, SiN, HfSi, AlON, SiO, SiC, or ZnO.

20. The semiconductor structure of claim 14, wherein the seal liner comprises silicon oxycarbonitride.

* * * * *